(12) United States Patent
Endo

(10) Patent No.: US 9,946,169 B2
(45) Date of Patent: Apr. 17, 2018

(54) EXPOSURE APPARATUS AND DEVICE MANUFACTURING METHOD

(71) Applicant: CANON KABUSHIKI KAISHA, Tokyo (JP)

(72) Inventor: Masatoshi Endo, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1176 days.

(21) Appl. No.: 13/901,647

(22) Filed: May 24, 2013

(65) Prior Publication Data

US 2013/0329207 A1    Dec. 12, 2013

(30) Foreign Application Priority Data

Jun. 12, 2012   (JP) ................................ 2012-133273

(51) Int. Cl.
G03F 7/20    (2006.01)

(52) U.S. Cl.
CPC .......... G03F 7/70775 (2013.01); G03F 7/709 (2013.01)

(58) Field of Classification Search
CPC ...................................................... G03F 7/709
See application file for complete search history.

(56) References Cited

U.S. PATENT DOCUMENTS

| | | | |
|---|---|---|---|
| 5,760,878 A | 6/1998 | Oguchi | |
| 6,359,688 B2 | 3/2002 | Akimoto et al. | |
| 6,674,509 B2 | 1/2004 | Suzuki | |
| 7,072,777 B1 | 7/2006 | Wakui et al. | |
| 2006/0061742 A1 | 3/2006 | Kim | |
| 2006/0101928 A1 | 5/2006 | Binnard et al. | |
| 2008/0316460 A1 | 12/2008 | Loopstra et al. | |
| 2011/0001949 A1 | 1/2011 | Kwan | |

FOREIGN PATENT DOCUMENTS

| | | | |
|---|---|---|---|
| CN | 101248392 A | 8/2008 | |
| CN | 101364049 A | 2/2009 | |
| JP | 09-134864 A | 5/1997 | |
| JP | H10199795 A | 7/1998 | |
| JP | 11307448 A | 11/1999 | |
| JP | 2000082662 A | 3/2000 | |
| JP | 2002110526 A | 4/2002 | |

OTHER PUBLICATIONS

Notification of the First Office Action issued in corresponding Chinese Patent Application No. 201310222560.7 dated Nov. 17, 2014. English translation provided.
Office Action issued in Japanese Appln. No. 2012133273 dated Apr. 4, 2016.
Korean office action issued in Korean counterpart application No. KR10-2013-0066235, dated Aug. 27, 2015.
Office Action issued in Korean Patent Application No. 10-2017-0004131 dated Apr. 6, 2017.

*Primary Examiner* — Chia-How Michael Liu
(74) *Attorney, Agent, or Firm* — Rossi, Kimms & McDowell LLP

(57) ABSTRACT

An exposure apparatus of performing an exposure for each shot region on a substrate includes: a stage configured to move while holding the substrate; a measurement device configured to measure a vibration of the stage; and a controller, when the vibration of the stage measured by the measurement device during an exposure period of a shot region of a first substrate falls outside an allowable range, configured to change a control parameter when exposing a shot region of a second substrate to be exposed after the first substrate at the same position as the shot region of the first substrate so as to improve an exposure accuracy.

11 Claims, 22 Drawing Sheets

| 50 |
|---|
| ACCURACY IMPROVEMENT SHOT/ TP IMPROVEMENT SHOT/SHOT OF ANOTHER TYPE ~51 |
| X: 20, Y: 30, SPEED: 3 mm/sec, ACCELERATION: 1G ~52 |
| EXPOSURE STARTS AT PREDICTED TIME: 5 sec ~53 |
| ACCURACY TEST BY AMPLITUDE TOLERANCE ~54 |
| VIBRATION INFORMATION GENERATED DURING EXPOSURE PROCESS ~55 |

F I G. 21
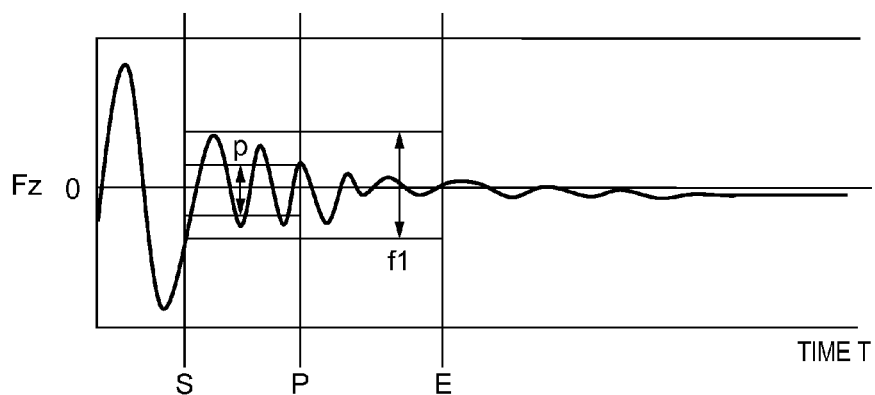
F I G. 22
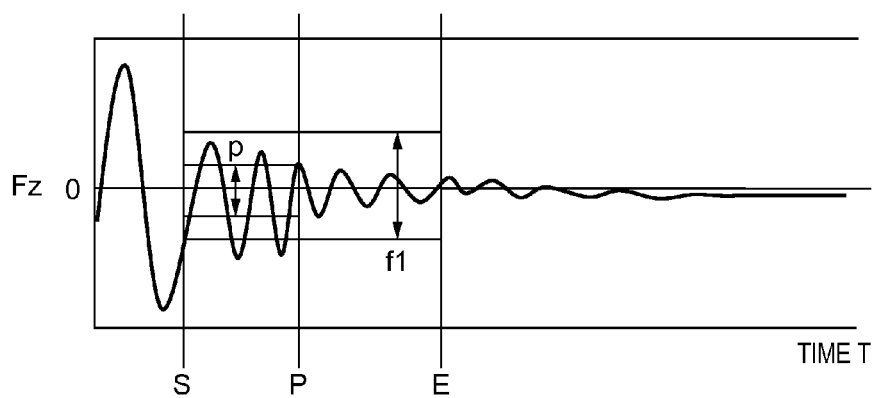
F I G. 23
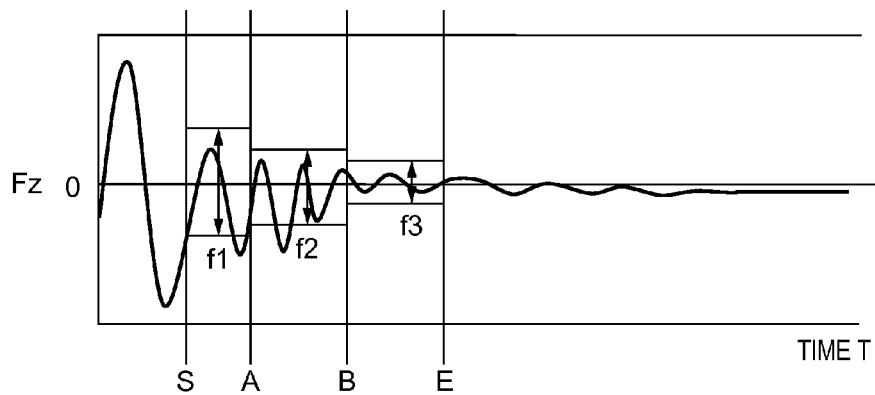

EXPOSURE APPARATUS AND DEVICE MANUFACTURING METHOD

BACKGROUND OF THE INVENTION

Field of the Invention

The present invention relates to an exposure apparatus for exposing a substrate through an original (mask) and a device manufacturing method using the exposure apparatus.

Description of the Related Art

A substrate stage (also referred to as a wafer stage) provided in a semiconductor exposure apparatus (stepper, scanner) vibrates after being driven, though only slightly. However rigid the substrate stage may be, it always vibrates upon receiving a force. Under the recent circumstances where accuracy on the order of nanometers is required, the influence of the slight vibration of the substrate stage on the exposure accuracy cannot be neglected.

To reduce the influence of the vibration of the substrate stage on the exposure accuracy, the exposure apparatus includes a measurement device for measuring the vibration of the substrate stage, in addition to the substrate stage. Widely employed is an exposure method in which the substrate stage is driven, the controller of the exposure apparatus confirms using the measurement device that the vibration has so converged not to affect the exposure accuracy, and then, the exposure process, that is, exposure light irradiation is started. In this case, after confirming that the vibration has converged to some extent or has a tendency to converge, the exposure process is started. For this reason, the influence of the vibration on the exposure accuracy is greatly reduced.

Not only a high accuracy and advanced microfabrication but also shortening the time of the exposure process of a substrate is required for the exposure apparatus. The count of reticle (mask) transfer to one substrate may be 100 at maximum, although it changes depending on the application purpose of the substrate. For this reason, it is necessary to shorten the time from the start of substrate stage driving till the start of the exposure process, that is, exposure light irradiation.

To shorten the time from the driving of the substrate stage to the start of the exposure process, Japanese Patent Laid-Open No. 9-134864 discloses a technique of starting exposure by predicting the time at which the vibration would converge, instead of using the convergence of the vibration of the substrate stage as a trigger to start the exposure process. The technique disclosed in Japanese Patent Laid-Open No. 9-134864 can eliminate the process (time) of confirming the convergence of the vibration and move forward the process (time) of causing the controller to issue an exposure start command as compared to the prior art. It is therefore possible to shorten the time from the driving of the substrate stage till the start of the exposure process.

SUMMARY OF THE INVENTION

However, in the exposure method in which the exposure process is started by predicting the convergence of the vibration of the substrate stage, whether the vibration has actually converged is unknown, and the exposure accuracy may be affected. As a result, the exposure accuracy required by the user may be unachieved, although the throughput is improved.

The present invention provides an exposure apparatus capable of, for example, simultaneously achieving high exposure accuracy and throughput.

The present invention provides an exposure apparatus of performing an exposure for each shot region on a substrate, the apparatus comprising: a stage configured to move while holding the substrate; a measurement device configured to measure a vibration of the stage; and a controller, when the vibration of the stage measured by the measurement device during an exposure period of a shot region of a first substrate falls outside an allowable range, configured to change a control parameter when exposing a shot region of a second substrate to be exposed after the first substrate at the same position as the shot region of the first substrate so as to improve an exposure accuracy.

Further features of the present invention will become apparent from the following description of exemplary embodiments with reference to the attached drawings.

BRIEF DESCRIPTION OF THE DRAWINGS

FIG. 21 is a timing chart of the vibration information of the substrate stage that has occurred in case 1;

FIG. 22 is a timing chart of the vibration information of the substrate stage that has occurred in case 2;

FIG. 23 is a timing chart of the vibration information of the substrate stage that has occurred in case 3;

DESCRIPTION OF THE EMBODIMENTS

Figure 1:
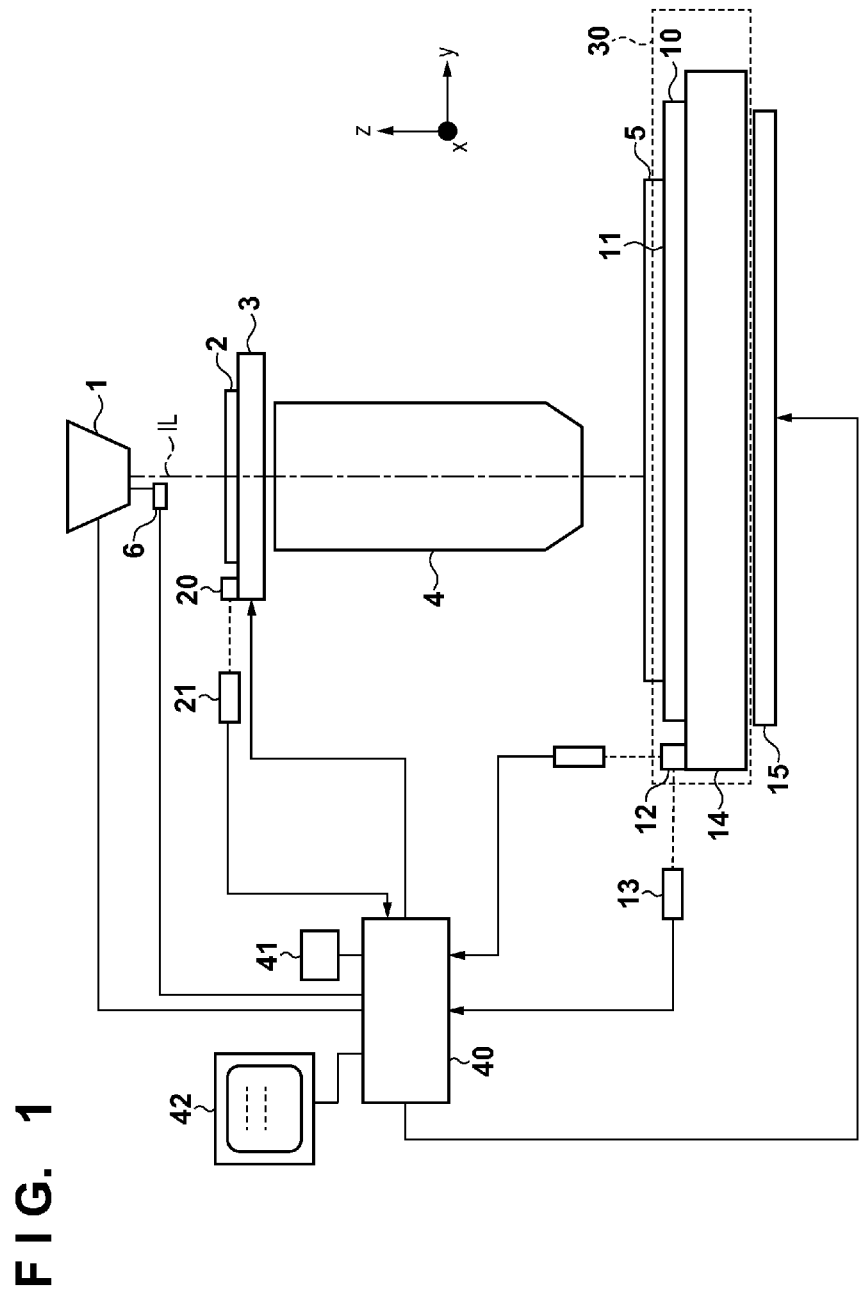
FIG. 1 is a view showing an exposure apparatus according to the present invention.

FIG. 1 is a view showing an exposure apparatus according to the present invention, which exposes a substrate for each shot region. Exposure light IL output from a light source 1 irradiates a mask (also referred to as an original or reticle) 2 by an illumination region set to a uniform illuminance. The mask 2 is placed on a mask stage 3. A moving mirror 20 is provided on the mask stage 3. An interferometer 21 is also provided which makes a laser beam strike the moving mirror 20 and receives the reflected light, thereby detecting the position of the mask stage 3. When performing a scan exposure, the mask stage 3 is scan-driven in the horizontal direction (y-axis direction) in FIG. 1.

A projection optical system 4 is arranged under the mask stage 3. The projection optical system 4 reduces a circuit pattern on the mask 2 at a predetermined reduction ratio and projects it to a substrate (wafer) 5 that is a photosensitive substrate. The substrate 5 is placed on a substrate placing portion 10. An optical sensor 6 can measure the light amount of the exposure light IL. A stage (substrate stage) 30 can move while holding the substrate 5. An interferometer 13 measures reflected light obtained by making a laser beam strike a moving mirror 12 placed on the substrate stage 30, thereby detecting the position and vibration of the substrate stage 30 with respect to the x- and y-axes. The interferometer 13 is attached to the upper portion of the substrate stage 30 as well so as to detect the position and vibration of the substrate stage 30 in the z-axis direction. The interferometer 13 forms a measurement device that measures the vibration of the substrate stage 30.

Figure 2:
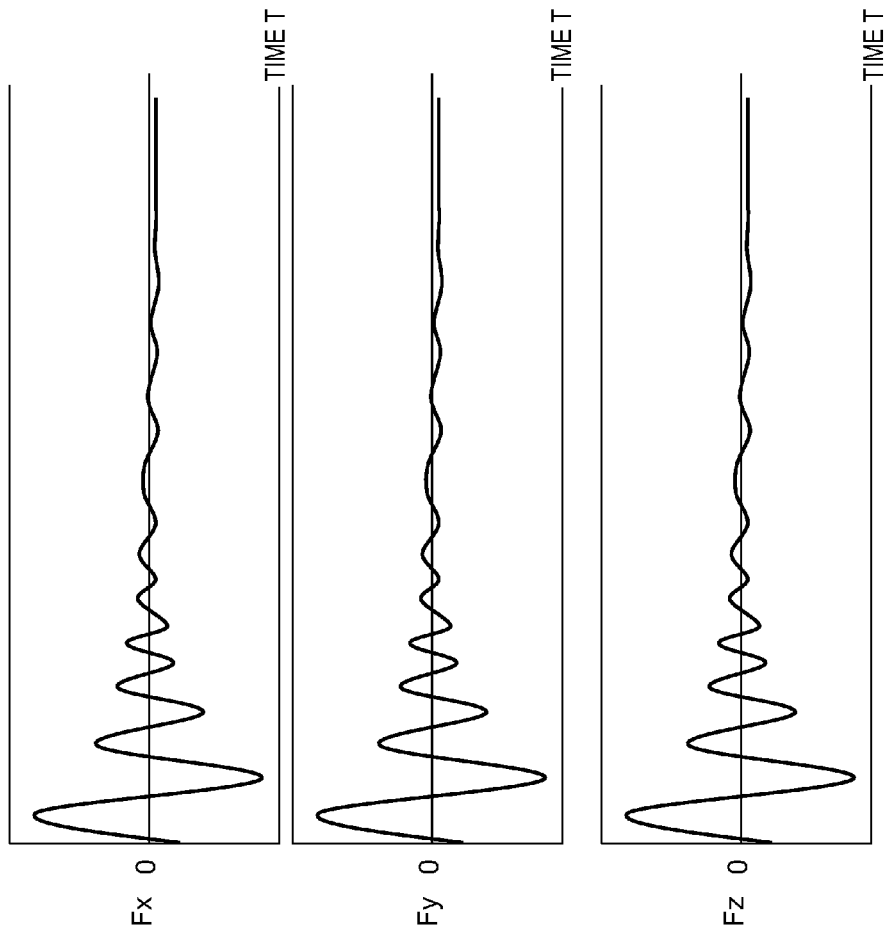
FIGS. 2A to 2C are timing charts showing the states of vibrations of a substrate stage after driven.

FIGS. 2A to 2C are timing charts schematically showing vibrations generated in the x-, y-, and z-axes after the substrate stage 30 is driven. The ordinate represents amplitudes Fx to Fz of the generated vibrations. O represents the center of each axis. Each vibration is positive on the upper side and negative on the lower side. The abscissa represents a time T, and the time elapses rightward. According to the general substance principle, the amplitude (vibration) of the substrate stage 30 converges as the time elapses. In the conventional exposure method presented in the section of "Related Art", a controller 40 measures, using the laser interferometer 13, the vibrations as shown in FIGS. 2A to 2C up to the points without influence on the exposure accuracy and commands the light source 1 to emit the exposure light.

The substrate placing portion 10 is supported by a support member 14. The substrate placing portion 10 and the support member 14 will be referred to as the substrate stage 30 hereinafter altogether. Although not illustrated, an actuator formed from a vertical air spring is provided on the upper surface of a driving unit 15 of the substrate stage 30 so that the substrate stage 30 can freely be driven in the x, y, and z directions. When performing a scan exposure, the substrate stage 30 is scan-driven in the horizontal direction (y-axis direction) in FIG. 1, like the mask stage 3. Note that the substrate stage 30 and the mask stage 3 are scan-driven in opposite directions by the scan exposure operation. In a stationary exposure, neither the mask stage 3 nor the substrate stage 30 is driven during exposure.

Figures 3, 4:
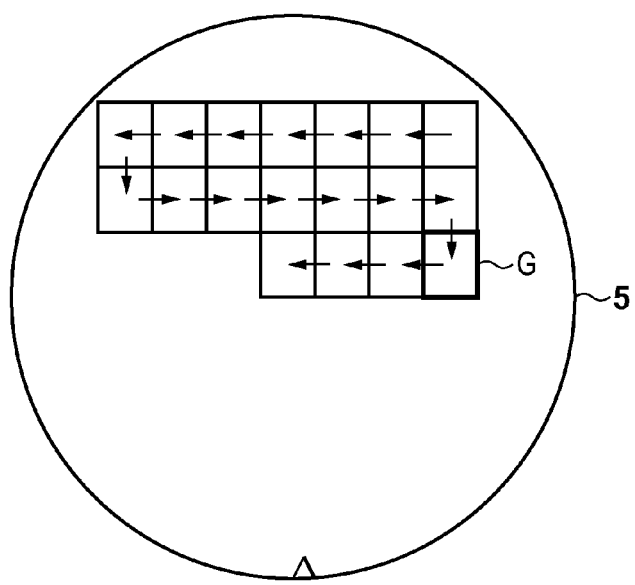
FIG. 3 is a view showing an exposure process repeated for shots.
FIG. 4 is a view showing information added to a shot.

FIG. 3 is a view showing, from the upper side, a state in which the design (circuit pattern) on the mask 2 is transferred onto the substrate 5. The design (circuit pattern) drawn on the mask 2 is transferred to each shot region (shot) of the substrate 5. Normally, after one shot is exposed, the substrate stage 30 is step-driven in the x- and y-axis directions, and the exposure is repetitively performed, as indicated by the arrows in FIG. 3. The start of the exposure process (output of the exposure light IL) and the driving of the substrate stage 30 and the mask stage 3 are performed, via the cable of a LAN or the like, from the controller 40 formed from a PC including a CPU. The controller 40 also collects all the measured values of the positions or vibrations of the mask stage 3 and the substrate stage 30 from the laser interferometers. The collected data (information) are saved in a storage unit 41 formed from a memory or the like.

The storage unit 41 also stores a condition value (for example, allowable range value (f1 in FIG. 22) of the amplitude of the vibration) representing whether the exposure accuracy meets the condition required by the user. The condition value does not indicate the exposure accuracy itself but can guarantee the exposure accuracy when the condition value is met. The storage unit 41 also stores a tolerance value (p in FIG. 22) used to determine whether improvement of throughput TP is possible and a time (S-P in FIG. 22) from an exposure start time S to an investigation end time P of the tolerance value p (they will altogether be referred to as condition information representing whether TP shortening is possible). The condition information representing whether TP shortening is possible is used to further improve the TP when the vibration of the substrate stage 30 is small. The storage unit 41 also stores a prerequisite effective for accuracy improvement, which is used in the flowcharts of FIGS. 17 to 19. The user sends a driving command to the controller 40 via a console unit 42. The console unit displays the operation state of the apparatus or information representing occurrence of an error (abnormality).

FIG. 4 is a view virtually representing information added to a shot. Out of an information region 50 of the shot, a memory region 51 representing the state of the shot stores information distinguishably representing whether the shot is a target of accuracy improvement, a target of TP improvement, or a shot of another type. An accuracy improvement target shot is a shot that is determined not to guarantee the exposure accuracy required by the user by the conventional exposure processing method and needs to execute an accuracy improvement measure. The accuracy improvement measure changes the control parameters at the time of exposure to improve the exposure accuracy. A TP improvement target shot is a shot that is determined to be able to improve the TP and guarantees meeting the exposure accuracy required by the user even when the TP improvement measure is executed. The TP improvement measure moves up the start of exposure.

A memory region 52 of the shot representing the driving speed (acceleration) and driving coordinates of the substrate stage 30 stores the driving speed and acceleration of the shot and information representing the coordinates to which the substrate stage is to be driven to start the exposure process. In the embodiment to be described later, when a correction value or correction formula to execute the accuracy improvement measure is calculated, the correction value is added to or subtracted from the driving position (coordinates) in the memory region 52. A memory region 53 stores information representing the exposure processing method used to expose the target shot and the predicted time at which the vibration would converge. A memory region 54 stores information representing the reason why the shot state in the memory region 51 is defined so. A memory region 55 stores vibration information generated by the shot during exposure.

Embodiment

In the exposure apparatus of the present invention, an exposure process is performed for a shot of the substrate 5, and it is determined in the exposure process whether the vibration of the substrate stage 30 falls within the allowable range. An accuracy improvement measure setting process performed upon determining that the vibration of the substrate stage 30 falls outside the allowable range will be described with reference to FIGS. 5 to 19. In addition, a TP improvement measure setting process performed upon determining that the TP can be improved in consideration of the influence of the vibration of the substrate stage 30 on the exposure performance will be described with reference to FIGS. 5 and 20. All the processes of the flowcharts of FIGS. 5 to 20 and the operation instructions (commands) of the actuator portion (mask stage 3, substrate stage 30) described in the flowcharts are executed by the controller 40.

Figure 5:
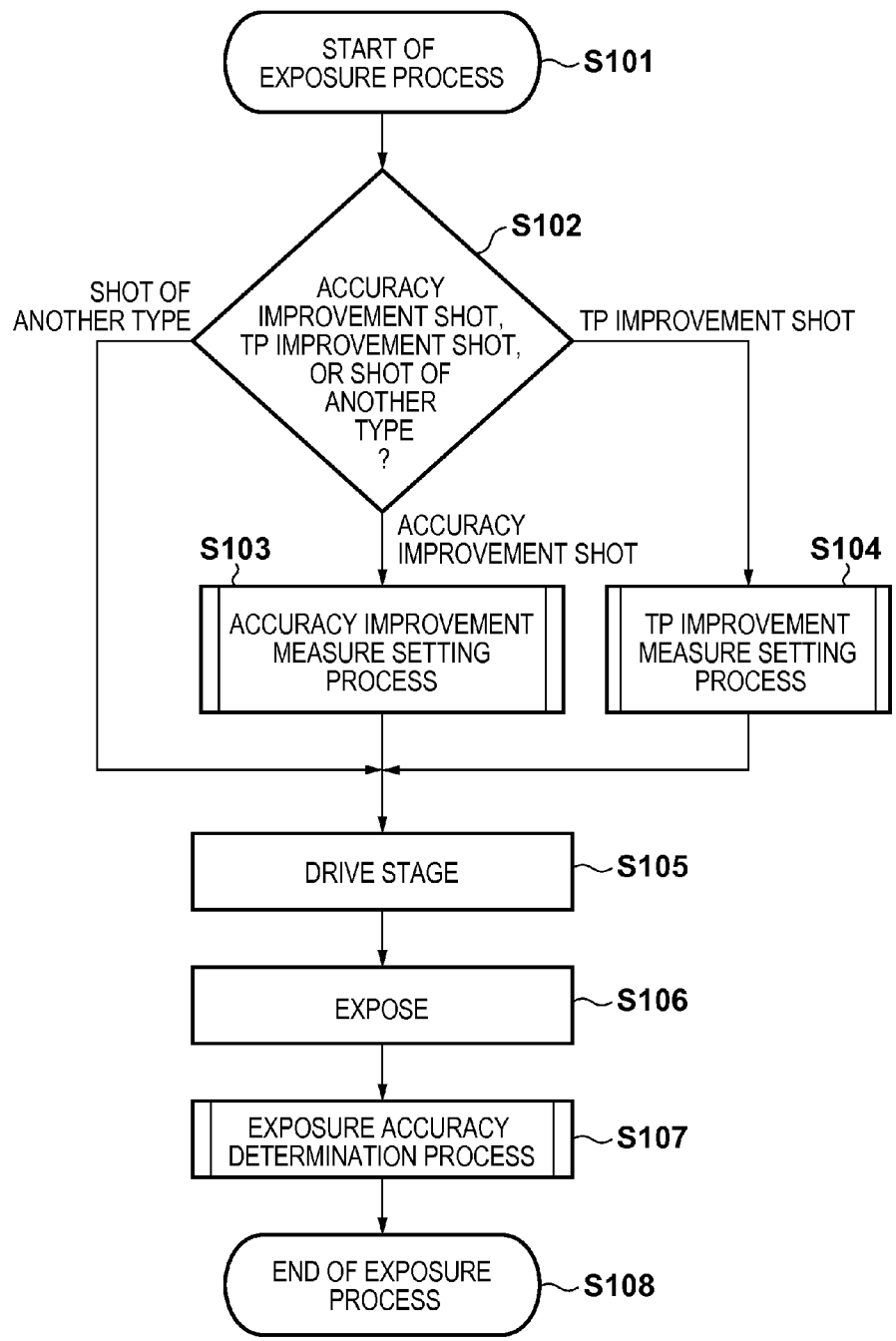
FIG. 5 is a flowchart of the exposure process.

The flowchart shown in FIG. 5 illustrates a process from the start (step S101) to the end (step S108) of an exposure process for one shot. In step S102 before an exposure, the controller 40 inquires of the storage unit 41 about whether the exposure target shot is a shot (accuracy improvement shot) to perform an accuracy improvement measure, a shot (TP improvement shot) to perform a TP improvement measure, or a shot of another type. The controller 40 acquires information of the memory region 51 representing the shot state in FIG. 4. Upon judging in step S102 that the shot is of another type, the controller 40 drives the substrate stage 30 in accordance with the position, orientation, speed, acceleration, and the like of the substrate stage 30 stored in the memory region 52 of the storage unit 41 in step S105. After driving the substrate stage 30, the controller 40 performs the exposure process in step S106 by irradiating the shot with exposure light in accordance with the exposure method and the predicted time of vibration convergence stored in the memory region 53 of the storage unit 41. In step S107, the controller 40 determines the influence of the vibration of the substrate stage 30 on the exposure accuracy during the exposure. Details of step S107 will be described with reference to the flowcharts of FIGS. 15 to 17. A "shot of another type" indicates a shot that can normally be exposed by the normal exposure without any problem in the exposure accuracy.

Upon judging in step S102 that the shot is an accuracy improvement shot, in step S103, the controller 40 performs an accuracy improvement measure setting process and changes the control parameters of the exposure process of the target shot to change the memory regions 52 and 53. The control parameters of the exposure process include the position, orientation, speed, and acceleration of the substrate stage 30 and the exposure start time. The controller 40 performs a substrate stage operation process in step S105 in accordance with the information of the control parameters of the memory regions 52 and 53 changed in step S103, and performs the exposure process in step S106. In step S107, the controller 40 determines the influence of the vibration of the substrate stage 30 on the exposure accuracy during the exposure. Details of the accuracy improvement measure in step S103 will be described with reference to the flowcharts of FIGS. 15 to 17. With the process of step S103, the position, orientation, speed, and acceleration of the substrate stage 30 in the memory region 52 and the exposure start time in the memory region 53 are changed. This change in step S103 makes it possible to suppress the vibration itself of the substrate stage 30 or execute the exposure process after convergence of the vibration. This allows to perform an exposure process less affected by the vibration and improve the accuracy.

Upon judging in step S102 that the shot is a TP improvement shot, in step S104, the controller 40 performs a TP improvement measure setting process and changes the exposure start time to change the memory region 53. After that, the controller 40 performs a substrate stage operation process in step S105, performs the exposure process in step S106, and determines the influence of the vibration on the exposure accuracy in step S107. Details of the TP improvement measure in step S104 will be described with reference to the flowchart of FIG. 18. Moving up the exposure start time in the memory region 53 in step S104 allows to shorten the time up to the start of the exposure and improve the TP.

Figure 6:
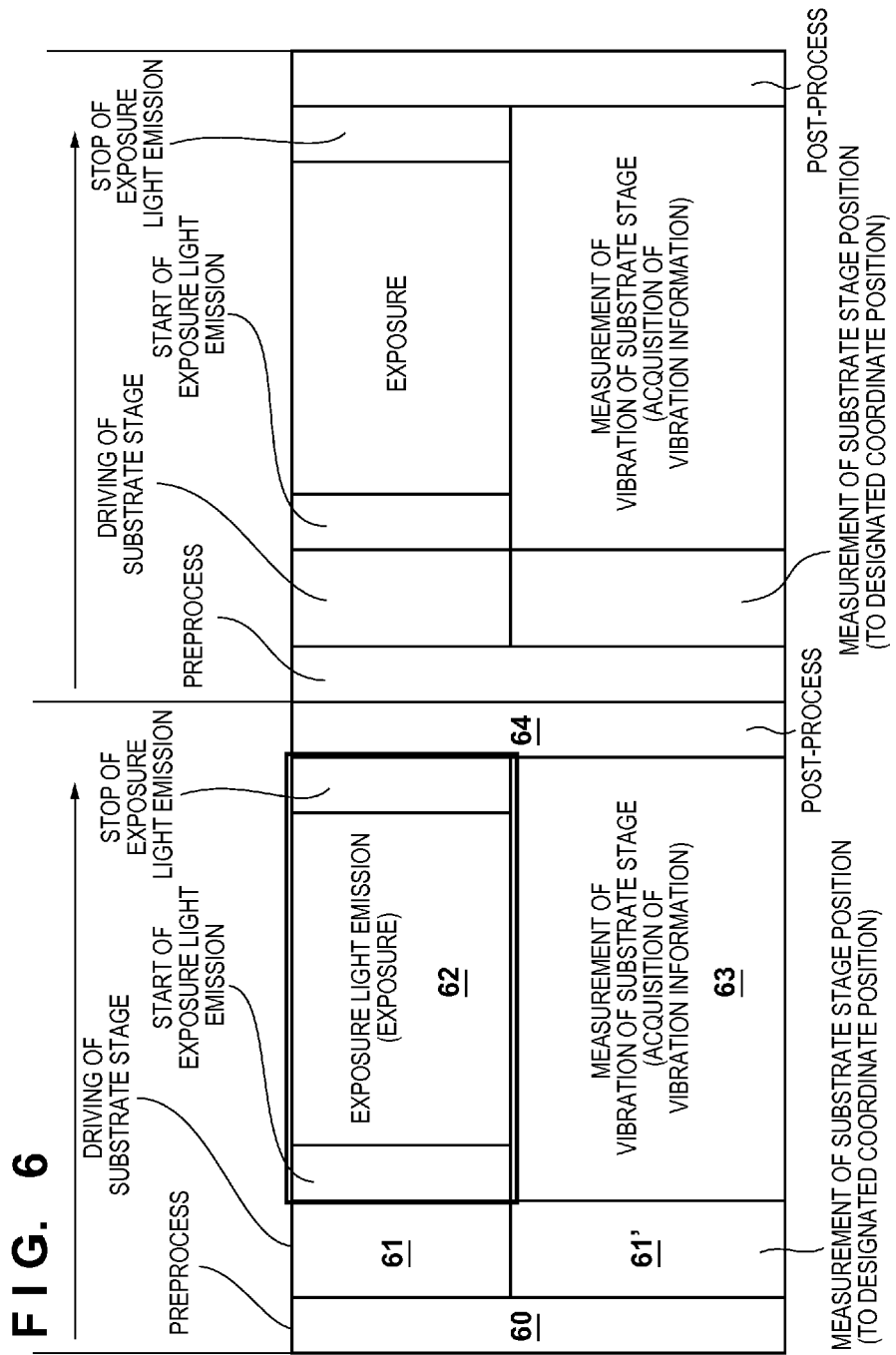
FIG. 6 is a sequence chart of the exposure process for two shots.

FIG. 6 is a sequence chart sowing a sequence representing the contents of an exposure process executed for two shots. In this sequence, the exposure is assumed to be a stationary exposure because of the ease of the explanation. An arrow indicates the exposure process of one shot from the start to the end. A preprocess 60 represents the processes of steps S102 to S104 in FIG. 5. With this preprocess, driving of the substrate stage 30 in step S105 and the control parameters of the exposure process in step S106 are defined. Driving 61 of the substrate stage corresponds to step S105 of the flowchart shown in FIG. 5. The controller 40 drives the substrate stage 30 in accordance with the position, orientation, speed, acceleration, and the like of the substrate stage 30 that are the contents of the memory region 52.

Measurement 61' of the position of the substrate stage 30 is executed in parallel to the driving 61 of the substrate stage 30. The measurement 61' of the position of the substrate stage 30 is performed using the laser interferometer 13. An exposure process 62 corresponds to step S106 of the flowchart shown in FIG. 5. Emission of exposure light is started, and exposure light irradiation is continued until the pattern (circuit pattern) on the mask 2 is printed on a resist (not shown) applied to the substrate 5. The exposure amount (dose) necessary for printing on the resist changes depending on the photosensitivity of the resist, whether the exposure is a scan exposure or a stationary exposure, the intensity and wavelength width of the light source itself, or the vibration state of the substrate stage 30. The exposure amount of the substrate 5 affects the exposure accuracy no matter how the amount is excessive or insufficient. After irradiation with a predetermined amount of exposure light, emission of the exposure light is stopped.

Figure 7:
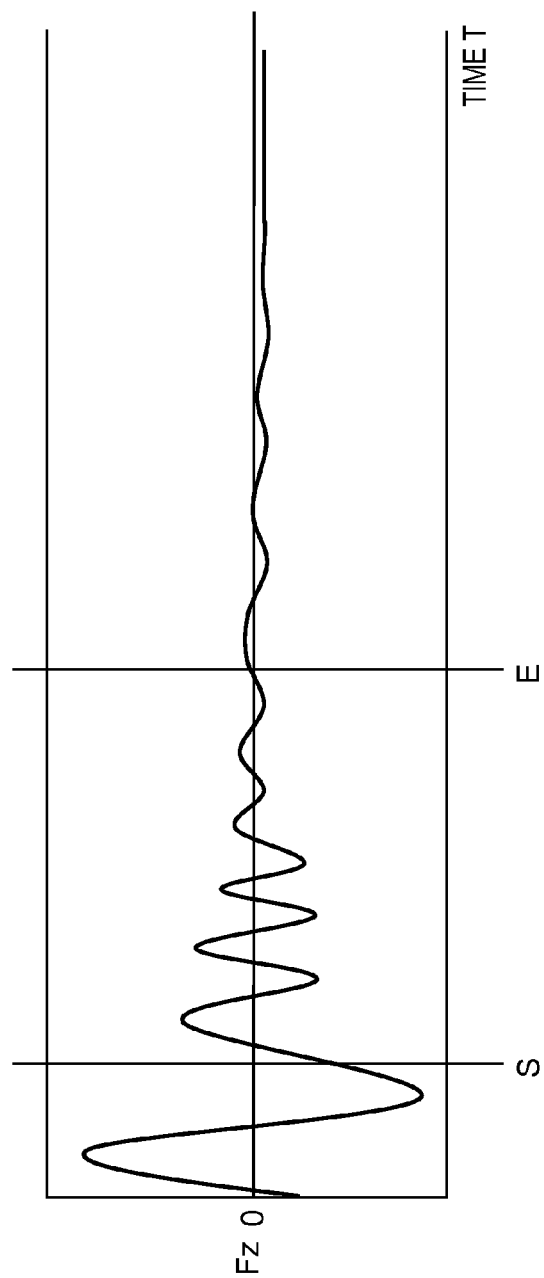
FIG. 7 is a timing chart showing vibration information.

During the time (exposure process 62) from the emission to the stop of the exposure light, measurement 63 of the vibration of the substrate stage 30 is performed in parallel. To acquire the vibration of the substrate stage 30, the laser interferometer 13 measures the substrate stage 30. In a scan exposure, the substrate stage 30 is driven in synchronism with the mask stage 3 even during the exposure process 62. However, the vibration state of the substrate stage 30 is parallelly measured in this case as well, and the present invention is applicable. In the present invention, information obtained by converting the measured value of the vibration of the substrate stage 30 acquired by the interferometer 13 into a waveform and specifying the time S at which the exposure has started and a time E at which the exposure has ended as shown in FIG. 7 will be referred to as vibration information.

A post-process 64 corresponds to step S107 in FIG. 5. In the post-process 64, the controller 40 analyzes the exposure accuracy based on the vibration state of the exposed shot. Flowcharts of a determination process of the influence of a vibration on the exposure accuracy will be described with reference to FIGS. 8 to 16. In the flowcharts of FIGS. 8 to 16, the controller 40 determines, based on whether the index of the vibration of the substrate stage 30 falls within the allowable range (tolerance), whether the exposure accuracy required by the user is achieved. In cases 1 to 4 to be explained below, the controller 40 selects at least one of the flowcharts shown in FIGS. 8 to 16 and determines the influence on the accuracy.

Figure 8:
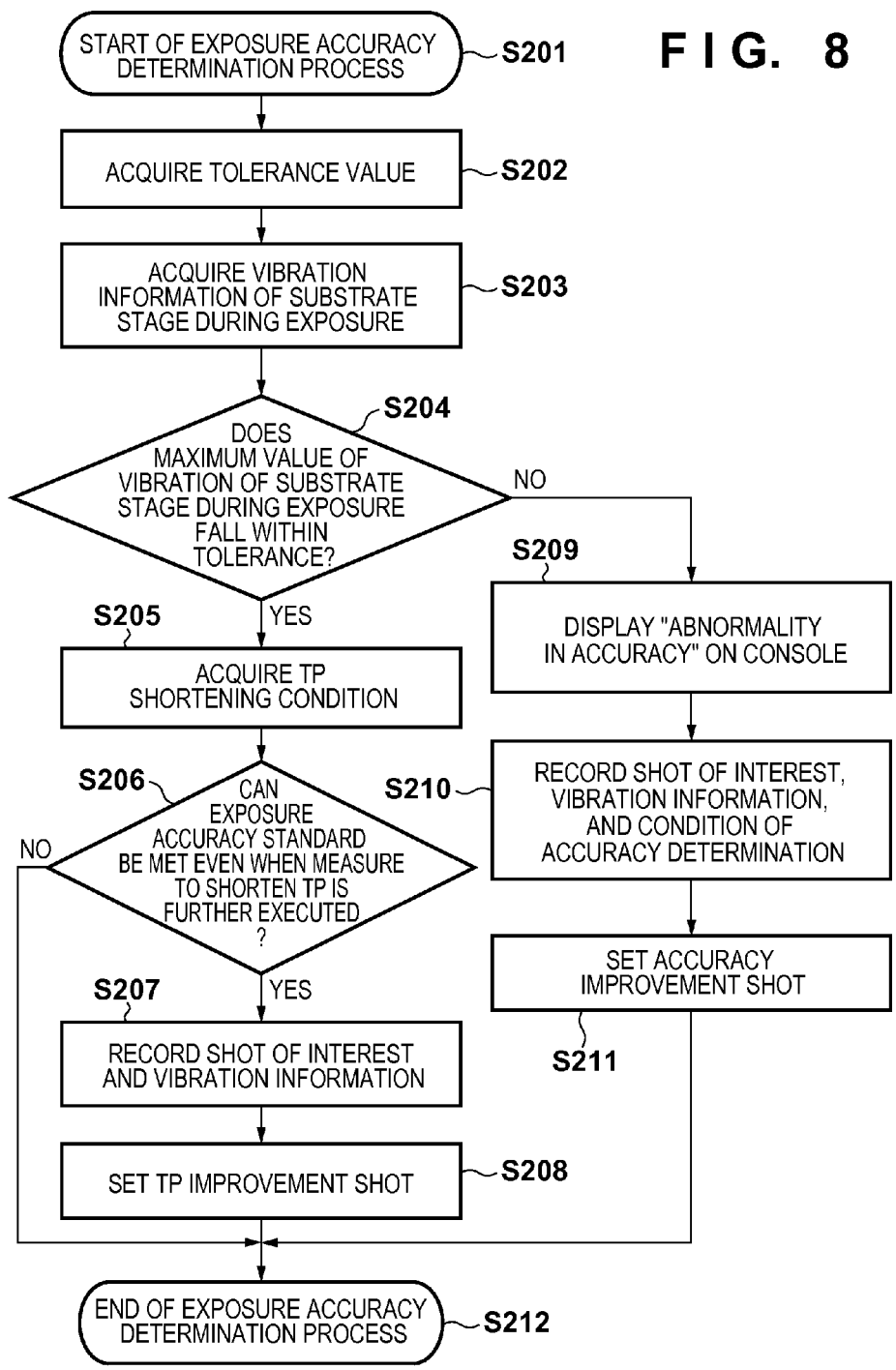
FIG. 8 is a flowchart of determining the accuracy by the tolerance of amplitudes.

In the flowchart of FIG. 8, the maximum value of the amplitude of the vibration of the substrate stage 30 during the exposure period of a shot is used as the index of the vibration.

Figure 9:
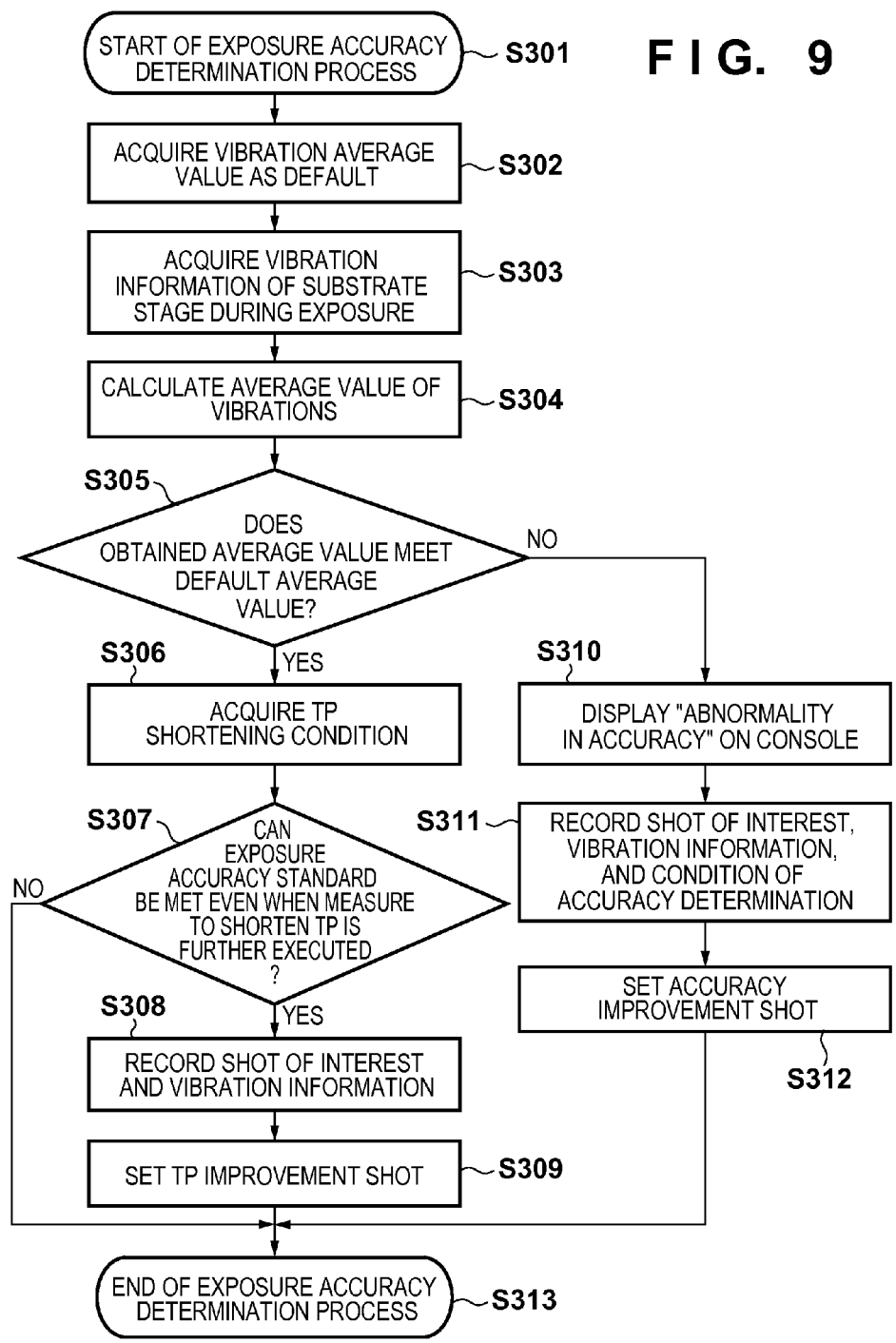
FIG. 9 is a flowchart of determining the accuracy by the average value of amplitudes.

In the flowchart of FIG. 9, the average value of the peaks of the amplitude of the vibration of the substrate stage 30 during the exposure period of a shot is used as the index of the vibration.

Figure 10:
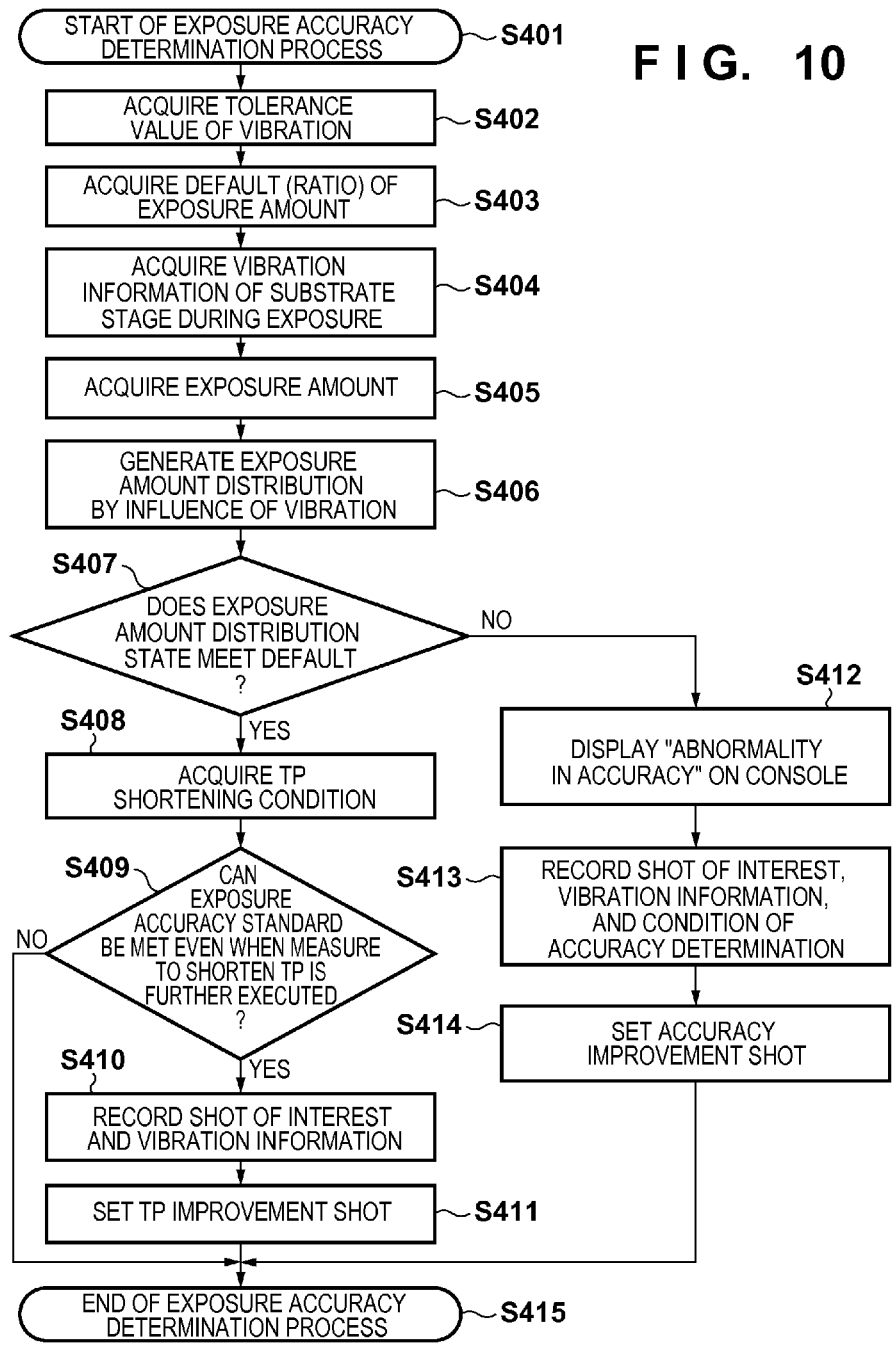
FIG. 10 is a flowchart of determining the accuracy by the vibration and the light amount distribution.

In the flowchart of FIG. 10, the ratio of the accumulated exposure amount (accumulated dose) during a period where the amplitude of the vibration of the substrate stage 30 during the exposure period of a shot has a predetermined value or less to the accumulated exposure amount during the exposure period is used as the index of the vibration.

Figure 12:
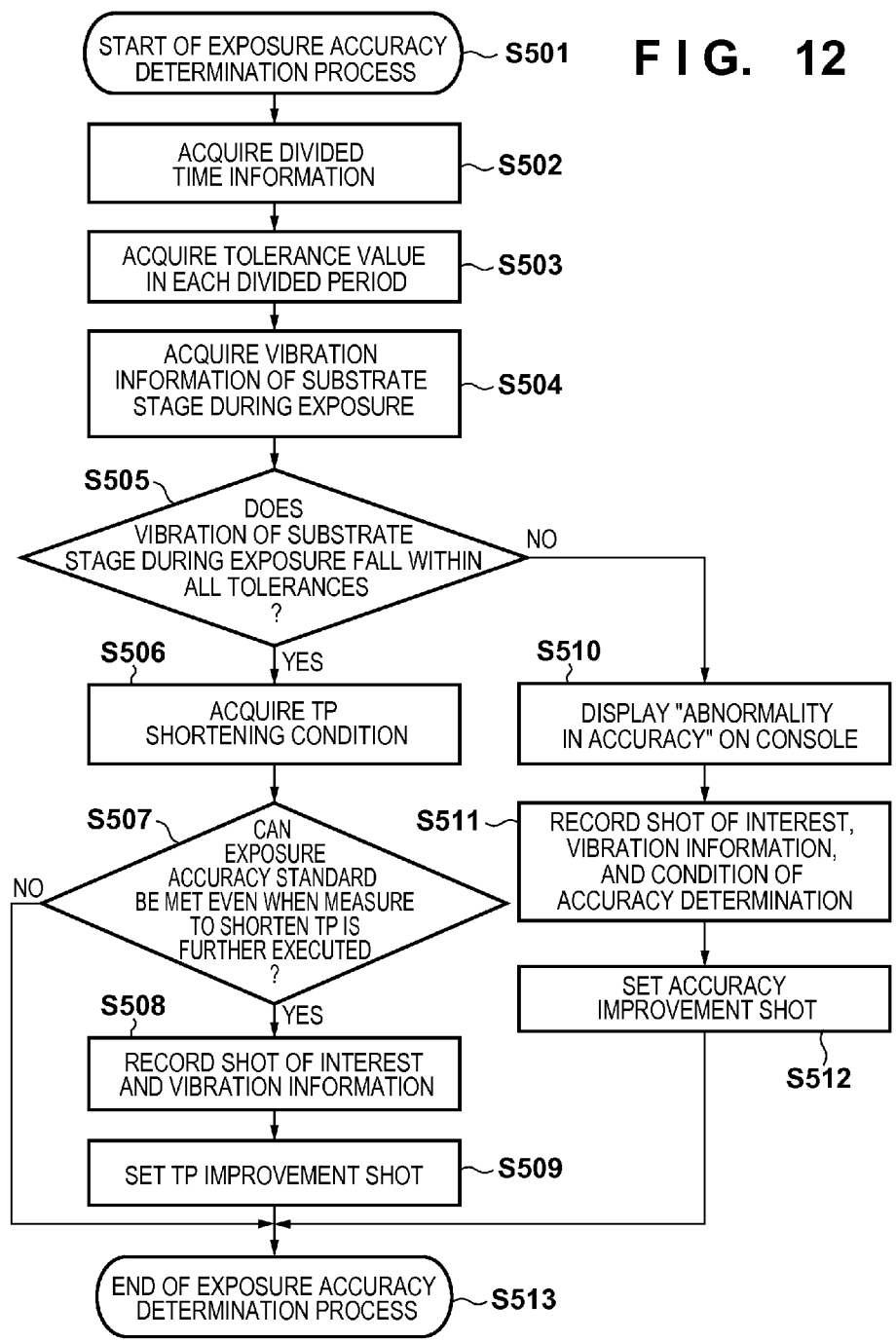
FIG. 12 is a flowchart of determining the accuracy by the tolerance of amplitudes in each section.

In the flowchart of FIG. 12, the exposure period of a shot is divided into a plurality of divided periods, and the maximum value of the amplitude of the vibration of the substrate stage 30 in each divided period is used as the index of the vibration.

Figure 14:
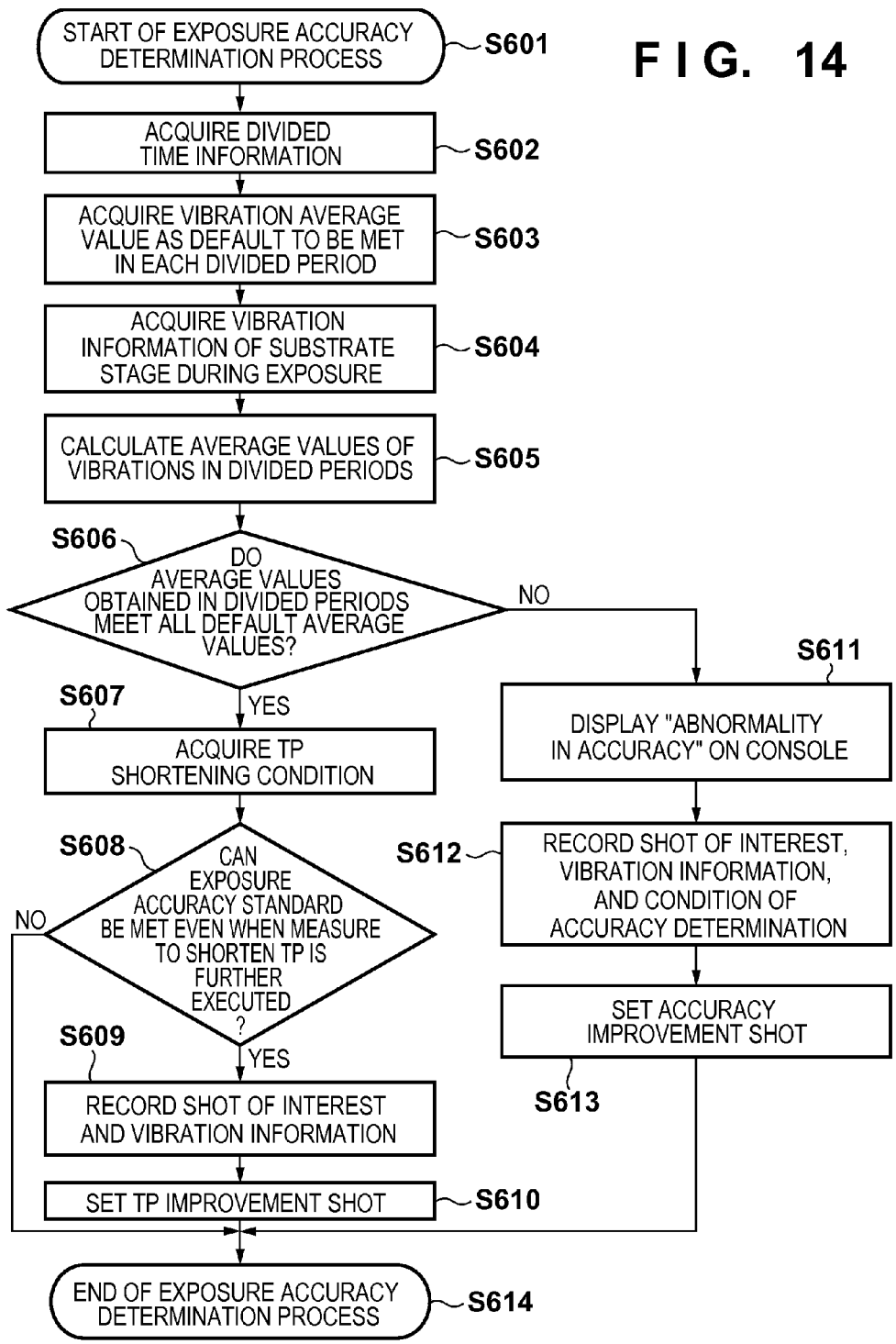
FIG. 14 is a flowchart of determining the accuracy by the average value of amplitudes in each section.

In the flowchart of FIG. 14, the average value of the peaks of the amplitude of the vibration of the substrate stage 30 in each divided period is used as the index of the vibration.

Figure 15:
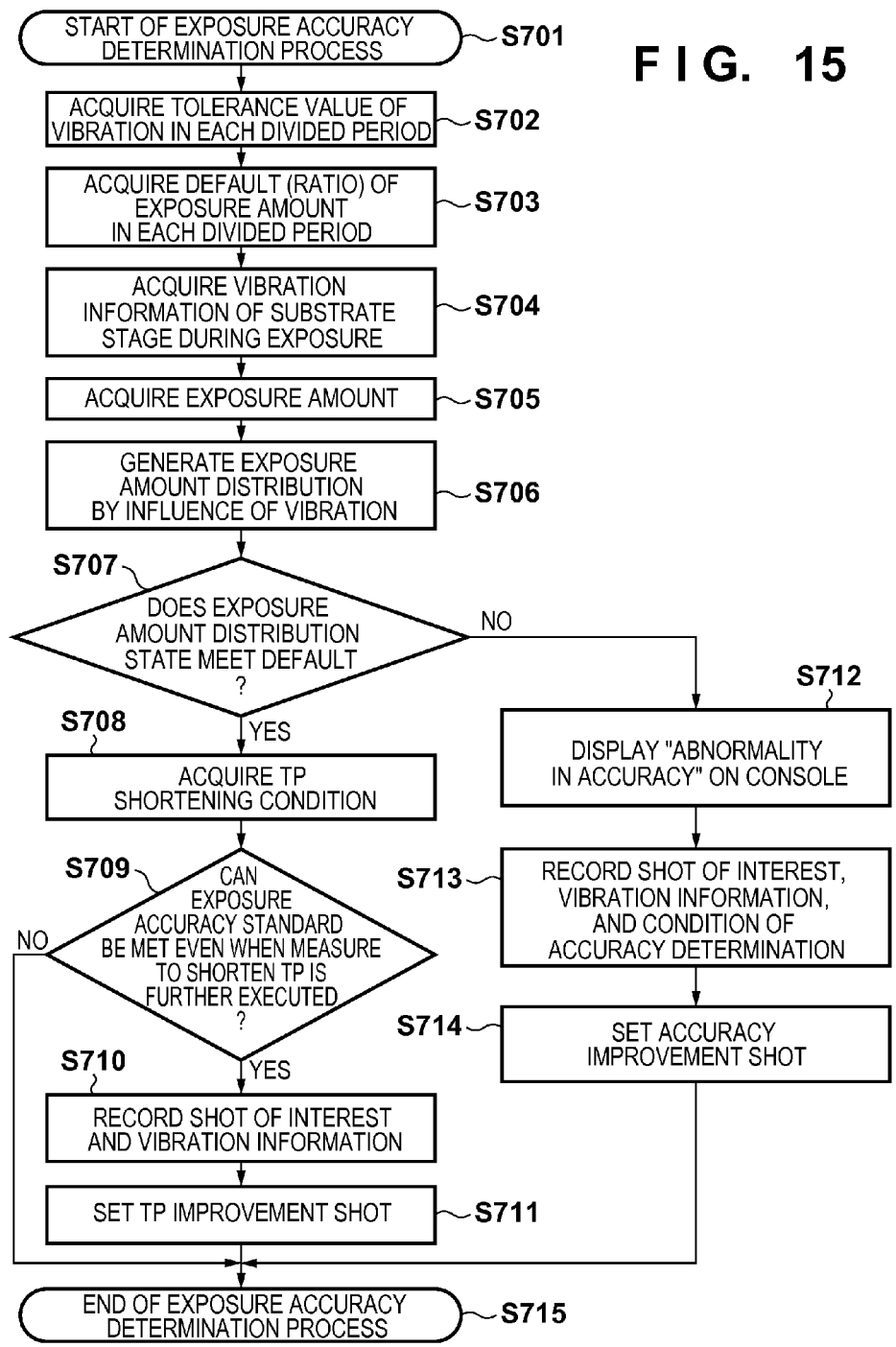
FIG. 15 is a flowchart of determining the accuracy by the vibration and the light amount distribution in each section.

In the flowchart of FIG. 15, the ratio of the accumulated exposure amount during a period where the amplitude of the vibration of the substrate stage 30 in each divided period has a predetermined value or less to the accumulated exposure amount during the exposure period is used as the index of the vibration.

<Determination Process of Influence of Vibration on Exposure Accuracy>
[Determination by Maximum Value of Vibration]

In the flowchart of FIG. 8, the controller 40 determines whether the exposure accuracy is met by determining whether the maximum value of the amplitude of the vibration of the substrate stage 30 during the exposure falls within a predetermined tolerance. The determination process of the flowchart of FIG. 8 will be referred to as "determination by the maximum value of the vibration" hereinafter. In step S201, the controller 40 starts the accuracy determination process. In step S202, the controller 40 acquires, from the storage unit 41, the value of the allowable range of the maximum value of the amplitude of the vibration as the tolerance condition. In step S203, the controller 40 acquires the vibration information of the substrate stage 30 during the exposure from the laser interferometer 13. In step S204, the controller 40 determines whether the maximum value of the amplitude of the acquired vibration of the substrate stage 30 falls within the predetermined tolerance during the exposure, thereby determining whether the exposure accuracy is met. If the vibration of the substrate stage 30 falls within the tolerance, the controller 40 further acquires a condition representing whether TP improvement is possible from the storage unit 41 in step S205.

In step S206, the controller 40 determines whether TP improvement is possible, based on the vibration information of the substrate stage 30 acquired in step S203 and the condition acquired in step S205. More specifically, as shown in FIG. 22, when the peak values of the vibration of the substrate stage 30 during the time from the exposure start time S to the TP investigation time P fall within the tolerance width (range value) p used to determine whether TP improvement is possible, the controller 40 determines that TP improvement is possible. The peak values of the vibration need not always fall within the tolerance width p used to determine whether TP improvement is possible during the time from the exposure start time S to the investigation time P. The peak values of the vibration need only fall within the tolerance width p at the investigation time P. Upon determining that TP improvement is possible, in step S207, the controller 40 saves, in the storage unit 41, the shot of interest and the vibration information acquired in step S203. In step S208, the controller 40 stores and sets, in the memory region 51 of the storage unit 41, the shot at the same coordinates of another substrate to be transported and exposed later as a shot where TP improvement is possible. After the setting process of step S208, the controller 40 ends the determination process of the influence on the exposure accuracy in step S212.

Upon determining in step S206 that TP improvement is impossible, the controller 40 advances to step S212 and ends the determination process of the influence on the exposure accuracy. Upon determining in step S204 that the vibration of the substrate stage 30 does not fall within the tolerance, in step S210, the controller 40 determines that the exposure accuracy required by the user is not met, and reports an error (abnormality), for example, "abnormality in the accuracy" on the console unit 42. In step S211, the controller 40 saves, in the memory regions 54 and 55 of the storage unit 41, the vibration information of the shot of interest and the determination condition with which it has determined that the exposure accuracy is not met. In the flowchart of FIG. 8, the controller 40 saves the condition "determination by the maximum value of the vibration" in the storage unit 41. In step S211, the controller 40 sets the shot at the same coordinates of another substrate to be transported and exposed later as a shot (accuracy improvement shot) to execute an accuracy improvement measure, and stores the determination condition and the vibration information of the shot in the memory regions 51, 54, and 55 of the storage unit 41. The substrate for which it is determined whether the vibration of the substrate stage 30 falls within the tolerance constitutes a "first substrate". Another substrate set as the accuracy improvement shot based on the determination result of the "first substrate" constitutes a "second substrate". After the setting process of step S211, the controller 40 ends the determination process of the influence on the exposure accuracy in step S212.

In the process of step S210, the controller 40 saves, in the storage unit 41, the condition under which the exposure accuracy is not met. The same process is performed in the flowcharts of determining the exposure accuracy from FIG. 9 as well. The condition under which the exposure accuracy is not met is used, when executing a measure to recover the accuracy in FIGS. 17 to 19, to determine whether the recovery measure is effective for the condition (cause) under which the accuracy is not met.

The shot to perform the accuracy improvement measure or TP improvement measure is defined as the shot at the same coordinates of another substrate in the setting processes of steps S208 and S211 because of a characteristic representing that a vibration is generated in almost the same manner in the shot at the same coordinates based on the driving condition of the substrate stage 30. Using the characteristic of the substrate stage 30, shots adjacent to the shot to perform the accuracy improvement measure or TP improvement measure may be set as the shots to perform the accuracy improvement measure or TP improvement measure in the setting processes of steps S208 and S211.

If accuracy determination errors have continuously occurred, all shots of the substrate placed on the substrate stage 30 may be set as the shots to perform the accuracy improvement measure, regarding that an abnormality has occurred in the substrate stage 30 itself. Whether to define the shot to perform the accuracy improvement measure as the shot at the same coordinates of another substrate, adjacent shots, or all shots is stored (set) in the storage unit 41 in advance. The controller 40 defines the shot to perform the accuracy improvement measure in accordance with the setting. Note that in this embodiment, the accuracy improvement measure is performed for the shot at the same coordinates of another substrate.

[Determination by Average Value of Vibration]

In the flowchart of FIG. 9, the controller 40 calculates the average value of the peaks of the amplitude of the vibration from the vibration information of the substrate stage 30 during the exposure, and determines whether the exposure accuracy is met by determining whether the average value meets an average value as a default. When repeating exposure of a production lot, the exposure time of one shot fluctuates little, and the vibration state of the substrate stage 30 is normally the same as in the shots of the single substrate 5. However, if, for example, an abnormality occurred in the substrate stage 30, the peak value of the amplitude becomes large, and the average value of the vibration becomes large as the fluctuation of vibration state becomes large. This leads to a decrease in the exposure accuracy.

The determination process of the flowchart of FIG. 9 will be referred to as "determination by the average value of the vibration" hereinafter. In step S301, the controller 40 starts the accuracy determination process. In step S302, the controller 40 acquires, from the storage unit 41, the value of the allowable range of the average value of the vibration as a default condition. In step S303, the controller 40 acquires the vibration information of the substrate stage 30 during the exposure from the laser interferometer 13. In step S304, the controller 40 obtains the sum of the absolute values of all peaks of the amplitude of the vibration generated in the substrate stage 30 and divides the sum by the number of peaks, thereby calculating the average value. In step S305, the controller 40 determines whether the average value obtained in step S304 meets the default value acquired in step S302. If the average value obtained in step S304 meets the default value, the controller 40 performs the same processes as in steps S205 to S208 of FIG. 8 in steps S306 to S309 to determine whether further TP improvement is possible, and ends the determination process of the influence on the exposure accuracy in step S314. If the average value does not meet the default value in step S305, the controller 40 determines that the exposure accuracy required by the user is not met, and performs the same processes as in steps S209 to S211 of FIG. 8 in steps S310 to S312 to define the shot to perform the accuracy improvement measure. After the setting process of step S312, the controller 40 ends the determination process of the influence on the exposure accuracy in step S314.

[Determination by Exposure Amount Distribution]

Figure 11:
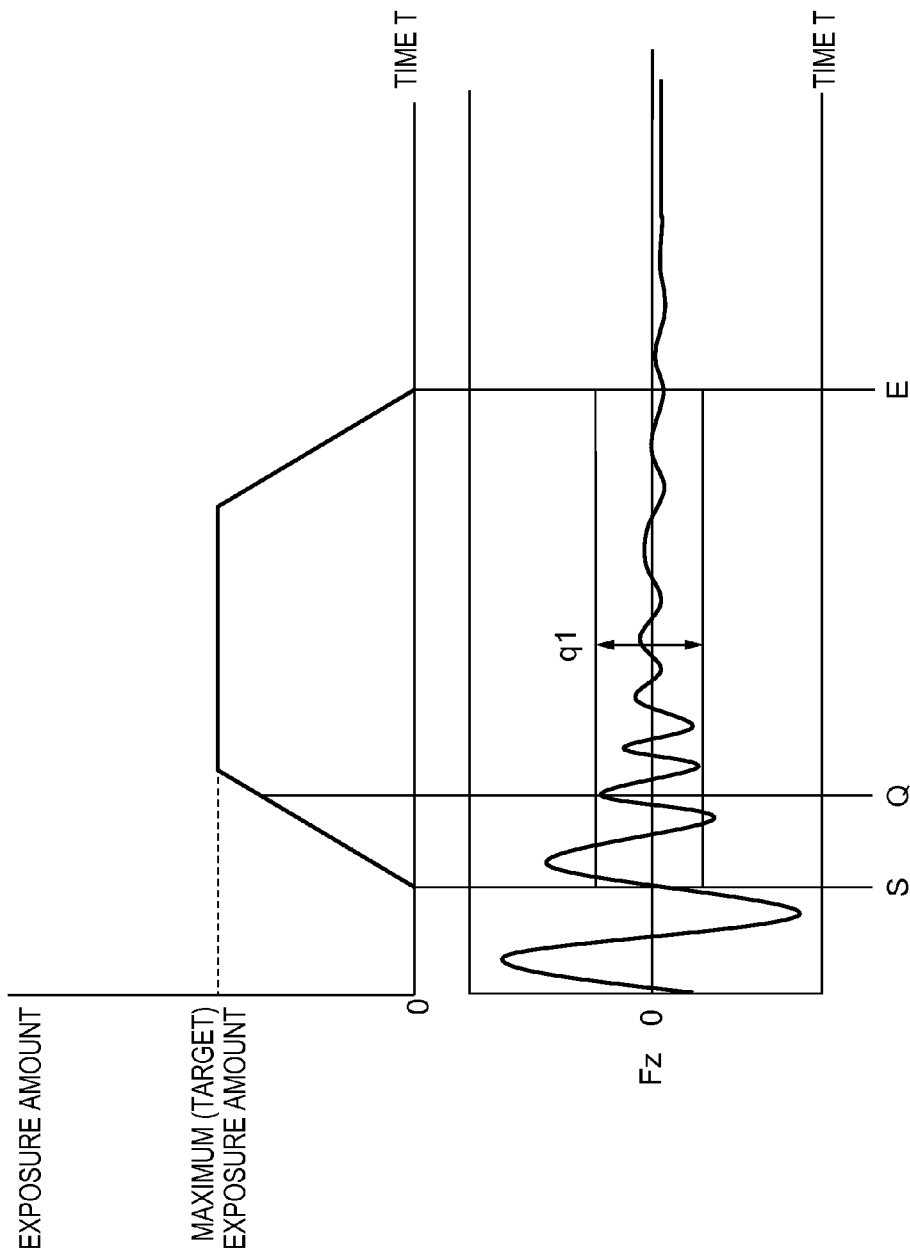
FIG. 11 is a timing chart showing the time transitions of the vibration and the light amount.

In the flowchart of FIG. 10, the controller 40 obtains the accumulated exposure amount in a time zone where the vibration is small, and determines the exposure accuracy by determining whether the ratio of the accumulated exposure amount in the time zone where the vibration is small to the accumulated exposure amount during the overall exposure period meets a default value. The vibration is segmented using the convergence of the peak of the amplitude into a predetermined tolerance value (q1 in FIG. 11) as a trigger. FIG. 11 illustrates the distribution of exposure amounts generated from the exposure start time S to the end time E and the vibration state of the substrate stage 30. In FIG. 11, the abscissa represents the time T. As is apparent from FIG. 11, a time is taken from the start of the exposure till obtaining the maximum exposure amount. The vibration has a tendency to attenuate. First, the controller 40 calculates the accumulated exposure amount in the time zone (from Q to E) where the vibration falls within the tolerance value q1 by integration. If the ratio of the accumulated exposure amount in the time zone where the vibration is small to the accumulated exposure amount during the overall exposure period (from the time S to the time E) meets a predetermined condition (higher than a default percentage), the controller 40 determines that an exposure that meets the accuracy has been executed.

Assume that the vibration temporarily converges into the tolerance q1, and the peak of the amplitude is generated again outside the tolerance q1. In this case, the area of the exposure amount after the vibration has temporarily converged into the tolerance q1 until the peak of the amplitude is generated again outside the tolerance q1 is not included as the exposure amount distribution in the time zone where the vibration is small. Although the distribution within the tolerance q1 is defined from Q to E for the descriptive convenience, the end is not necessarily set at E.

The determination of the flowchart of FIG. 10 will be referred to as "determination by the exposure amount distribution" hereinafter. In step S401, the controller 40 starts the accuracy determination process. In step S402, the controller 40 acquires the tolerance value q1 that defines the segmentation of the vibration. In step S403, the controller 40 acquires the default (ratio) value of the exposure amount as a default condition from the storage unit 41. In step S404, the controller 40 acquires the vibration information of the substrate stage 30 during the exposure from the laser interferometer 13. In step S405, the controller 40 acquires, from the light amount sensor 6, the exposure amounts from the start to the end of exposure to create the exposure amount distribution. In step S406, the controller 40 creates the exposure amount distribution. At this time, the controller 40 segments a portion where the peak of the amplitude falls within the tolerance value acquired in step S402, and creates an exposure amount distribution as shown in FIG. 11. The controller 40 integrates the exposure amount distribution by the time zone (from Q to E) where the amplitude is small to calculate the area of the exposure amount in the time zone where the vibration is small, and obtains the ratio of the exposure amount to that during the overall exposure period. In step S407, the controller 40 determines whether the calculated ratio value meets the default value acquired in step S402. If the ratio meets the default value, the controller 40 performs the same processes as in steps S205 to S208 of FIG. 8 in steps S408 to S411 to determine whether further TP improvement is possible, and ends the determination process of the influence on the exposure accuracy in step S415. If the ratio does not meet the default value in step S407, the controller 40 determines that the exposure accuracy required by the user is not met, and performs the same processes as in steps S209 to S211 of FIG. 8 in steps S412 to S414 to define the shot to perform the accuracy improvement measure. After the process of step S414, the controller 40 ends the determination process of the influence on the exposure accuracy in step S415.

[Determination by Plurality of Maximum Values of Amplitude]

Figure 13:
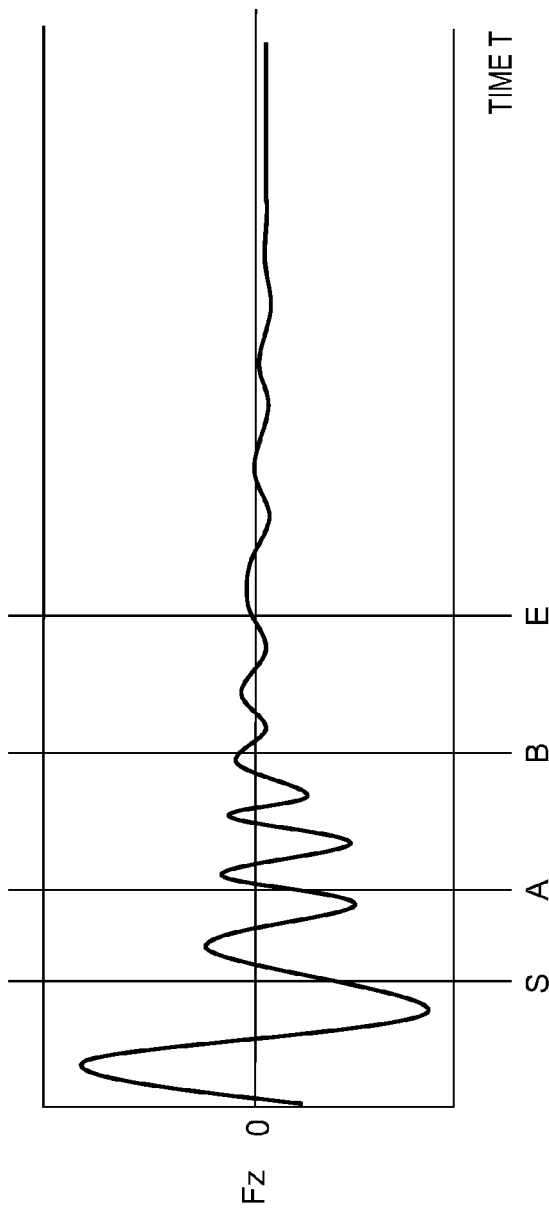
FIG. 13 is a timing chart showing an exposure time zone segmented into a plurality of sections.

In the flowchart of FIG. 12, the exposure period from the exposure light emission start time S to the stop time E is divided into a plurality of periods (divided periods) at predetermined or unspecified time intervals, as shown in FIG. 13. In FIG. 13, the exposure period S-E is divided into three divided periods S-A, A-B, and B-E at times A and B. Using a condition that the tolerance value becomes stricter along with the elapse of time, it is determined whether the exposure accuracy is met by determining in each divided period whether the default is met. The determination of the flowchart of FIG. 12 will be referred to as "determination by a plurality of maximum values of the amplitude" hereinafter. In step S501, the controller 40 starts the accuracy determination process. In step S502, to divide the exposure period, the controller 40 acquires time information to define the division from the storage unit 41. In step S503, the controller 40 acquires a tolerance value to be met in each divided period as a default condition from the storage unit 41. In step S504, the controller 40 acquires the vibration information of the substrate stage 30 during the exposure from the laser interferometer 13. In step S505, the controller 40 determines whether the vibration of the substrate stage 30 during the exposure falls within the tolerance acquired in step S502. If the default value is met, the controller 40 performs the same processes as in steps S205 to S208 of FIG. 8 in steps S506 to S509 to determine whether further TP improvement is possible, and ends the determination process of the influence on the exposure accuracy in step S513. If the default value is not met in step S505, the controller 40 determines that the exposure accuracy required by the user is not met, and performs the same processes as in steps S209 to S211 of FIG. 8 in steps S510 to S512 to define the shot to perform the accuracy improvement measure. After the process of step S512, the controller 40 ends the determination process of the influence on the exposure accuracy in step S513.

[Determination by Plurality of Average Values of Vibration]

In the flowchart of FIG. 14, the exposure period is divided, as in FIG. 12, the average value of the vibration is obtained in each divided period from the vibration information of the substrate stage 30, and it is determined whether the exposure accuracy is met by determining whether the average value meets the default value in each divided period. The determination of the flowchart of FIG. 14 will be referred to as "determination by a plurality of average values of the vibration" hereinafter. In step S601, the controller 40 starts the accuracy determination process. In step S602, to divide the exposure period, the controller 40 acquires time information to define the division from the storage unit 41. In step S603, the controller 40 acquires an allowable range of the average value of the vibration to be met in each divided period as a default condition from the storage unit 41. In step S604, the controller 40 acquires the vibration information of the substrate stage 30 during the exposure from the laser interferometer 13. In step S605, the controller 40 obtains the sum of the absolute values of the peaks of the amplitude of the vibration generated in the substrate stage 30 in each divided period and divides the sum by the number of peaks, thereby calculating the average value. In step S606, the controller 40 determines whether all the average values obtained in step S605 meet the default values acquired in step S601. If the default values are met, the controller 40 performs the same processes as in steps S205 to S208 of FIG. 8 in steps S607 to S610 to determine whether further TP improvement is possible, and ends the determination process of the influence on the exposure accuracy in step S614. If the default values are not met in step S606, the controller 40 determines that the exposure accuracy required by the user is not met, and performs the same processes as in steps S209 to S211 of FIG. 8 in steps S611 to S613 to define the shot to perform the accuracy improvement measure. After the process of step S613, the controller 40 ends the determination process of the influence on the exposure accuracy in step S614.

[Determination by Plurality of Exposure Amount Distributions]

Figure 16:
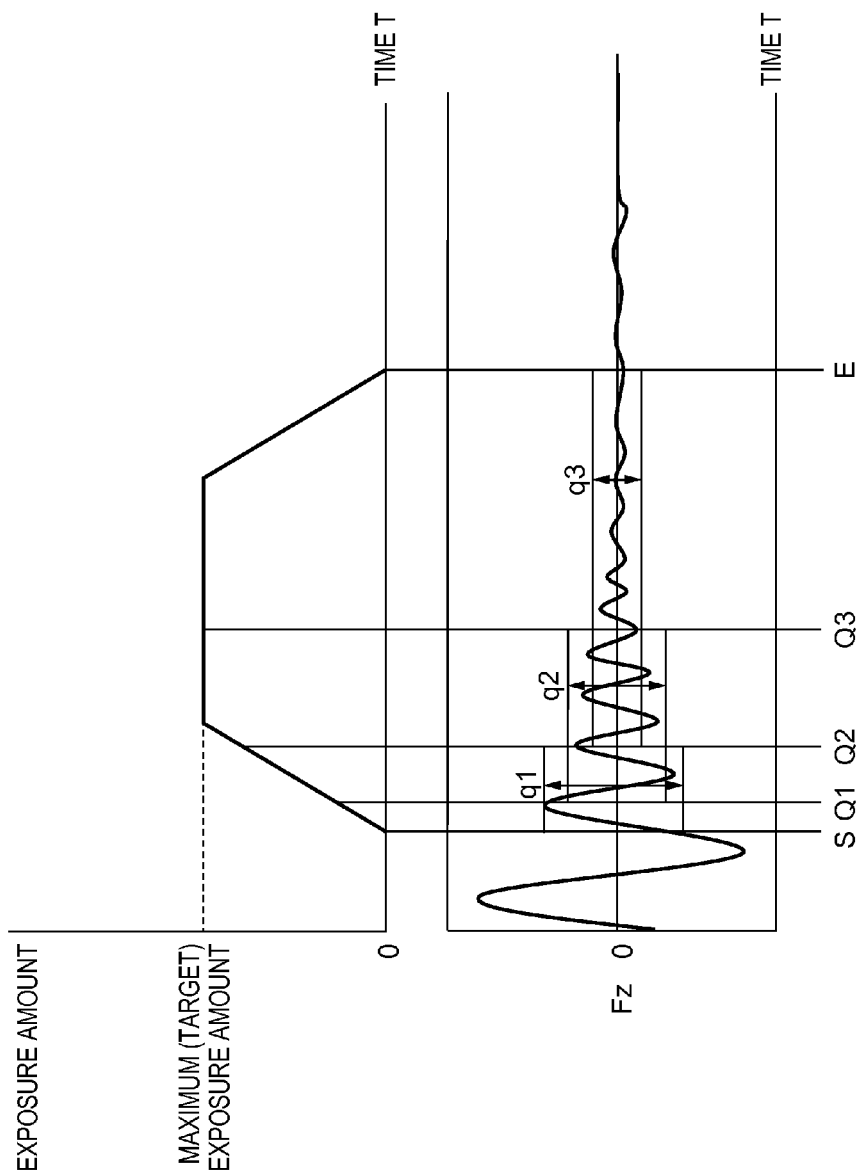
FIG. 16 is a timing chart showing the time transitions of the vibration and the light amount in each section.

In the flowchart of FIG. 15, the exposure period is divided by a plurality of different tolerance values (q1 to q3 in FIG. 16), and the exposure accuracy is determined by determining in each divided period whether the ratio of the exposure amount in the time zone where the vibration is small meets a default value. The flowchart of FIG. 15 is different from that of FIG. 10 in that the exposure period is divided into a plurality of divided periods. The exposure period is divided by the convergence of the peak values of the amplitude into a predetermined tolerance value (q1, q2, and q3 in FIG. 16). A peak portion where the peak value falls within the tolerance value q2 is the break between q1 and q2, and a peak portion where the peak value falls within the tolerance value q3 is the break between q2 and q3. The measurement for the tolerance q1 is started using the exposure start time S as a trigger, the measurement for the tolerance q2 is started using the convergence of the peak into the tolerance q1 as a trigger, and the measurement for the tolerance q3 is started using the convergence of the peak into the tolerance q2 as a trigger. FIG. 16 illustrates the distribution of exposure amounts generated from the exposure start time S to the end time E and the vibration state of the substrate stage 30. Based on the division of the tolerances q1, q2, and q3, the exposure period is divided into four divided periods S-Q1, Q1-Q2, Q2-Q3, and Q3-E. Unlike FIG. 11, the ratio of the exposure amount is obtained in each divided period.

The determination of the flowchart of FIG. 15 will be referred to as "determination by a plurality of exposure amount distributions" hereinafter. In step S701, the controller 40 starts the accuracy determination process. In step S702, the controller 40 acquires the tolerance values (q1 to q3 in FIG. 16) that define the segmentations of the vibration. In step S703, the controller 40 acquires each default ratio value as a default condition from the storage unit 41. In step S704, the controller 40 acquires the vibration information of the substrate stage 30 during the exposure from the laser interferometer 13. In step S705, the controller 40 acquires, from the light amount sensor 6, the exposure amounts from the start to the end of exposure to create the exposure amount distribution. In step S706, the controller 40 creates the exposure amount distribution. At this time, the controller 40 segments portions where the peaks of the amplitude fall within the tolerance values acquired in step S702, and creates a distribution (FIG. 16). The controller 40 calculates the area of the exposure amount in the time zone where the vibration is small in each of the divided periods (S-Q1, Q1-Q2, Q2-Q3, and Q3-E), and obtains the ratio to the entire exposure amount. In step S707, the controller 40 determines whether the ratio value calculated in each divided period meets the default value acquired in step S702. If the calculated ratio meets the default value, the controller 40 performs the same processes as in steps S205 to S208 of FIG. 8 in steps S708 to S711 to determine whether further TP improvement is possible, and ends the determination process of the influence on the exposure accuracy in step S715. If the ratio does not meet the default value in step S707, the controller 40 determines that the exposure accuracy required by the user is not met, and performs the same processes as in steps S209 to S211 of FIG. 8 in steps S712 to S714 to define the shot to perform the accuracy improvement measure. After the process of step S714, the controller 40 ends the determination process of the influence on the exposure accuracy in step S715.

The exposure accuracy determination process is performed using the flowcharts shown in FIGS. 8 to 16. As an application, whether TP shortening is possible may be determined by changing the default value application method. For example, changing the tolerance value of accuracy determination in FIG. 8 to the tolerance value p used to determine whether TP shortening is possible allows to determine whether TP shortening is possible. In addition, when the determination of the flowcharts shown in FIGS. 9 and 10 is performed using a stricter value to enable TP shortening, it is possible to determine whether TP shortening is possible. The flowchart of FIG. 12 can also be changed to a flowchart of determining whether TP shortening is possible by changing the default value to the tolerance value p used to determine whether TP shortening is possible. This also applies to the flowcharts of FIGS. 14 and 15. Measuring the vibration state during the exposure and applying the flowchart (algorithm) proposed by the present inventor allow not only to determine the state of the exposure accuracy but also to determine whether TP shortening is possible.

<Accuracy Improvement Measure Setting Process>

Figure 17:
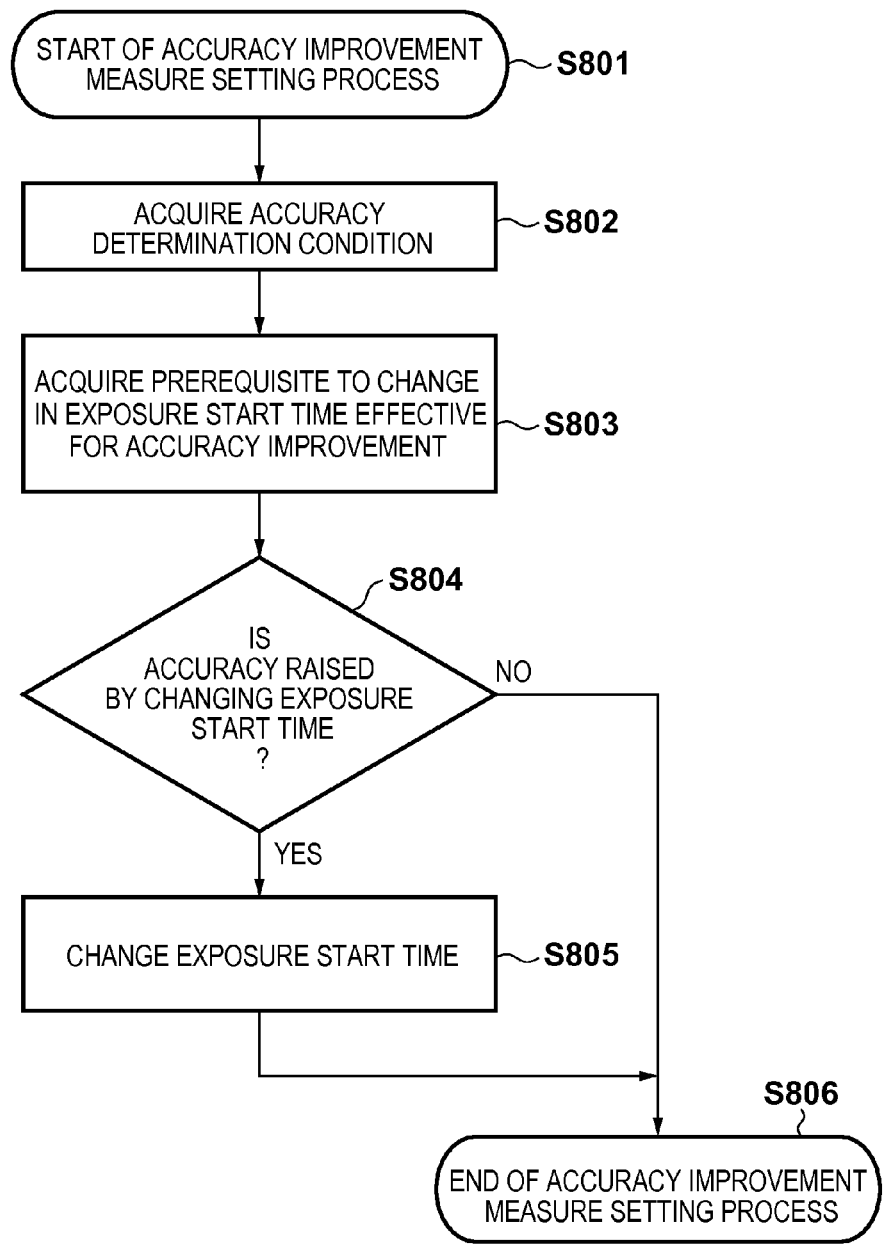
FIG. 17 is a flowchart of changing the exposure start time as a measure to improve the accuracy.
Figure 18:
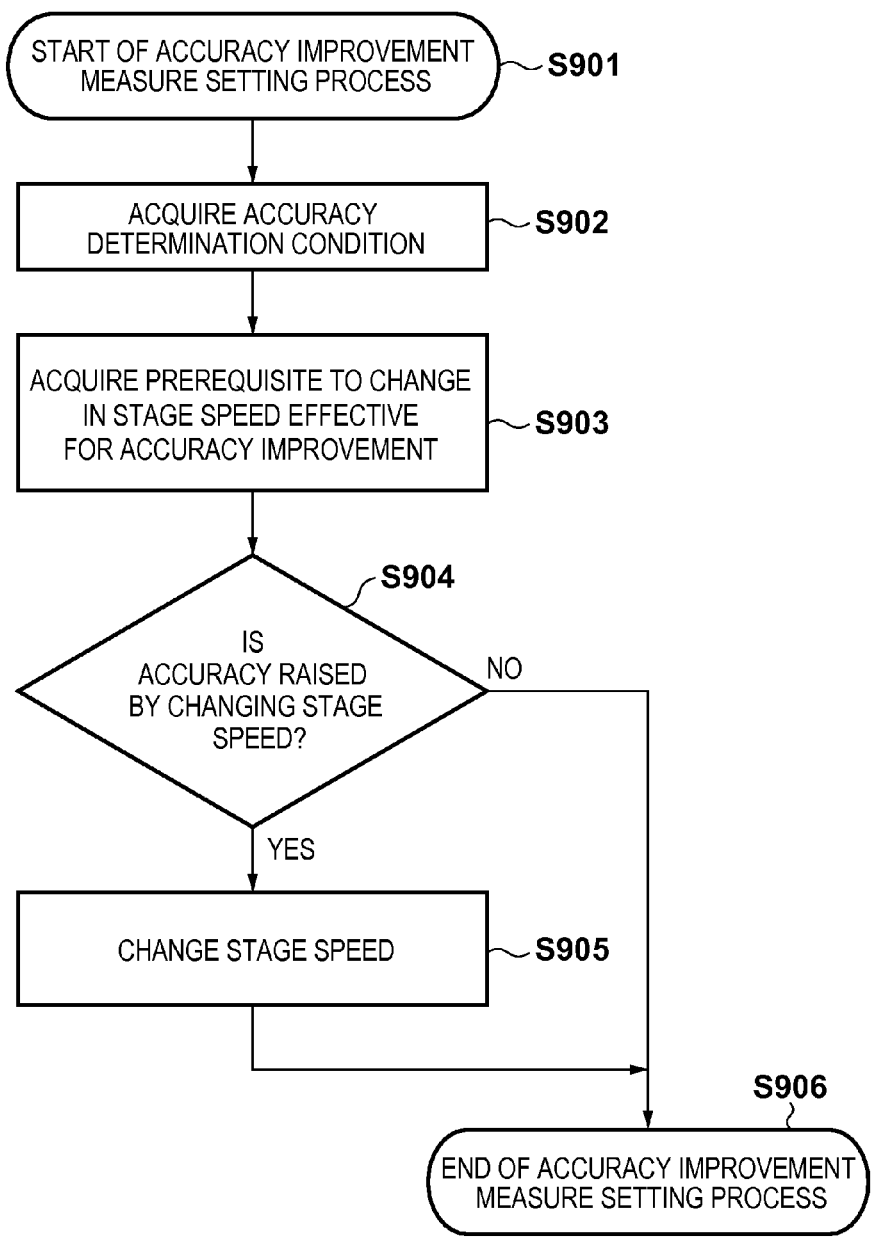
FIG. 18 is a flowchart of changing the speed of the substrate stage as a measure to improve the accuracy.
Figure 19:
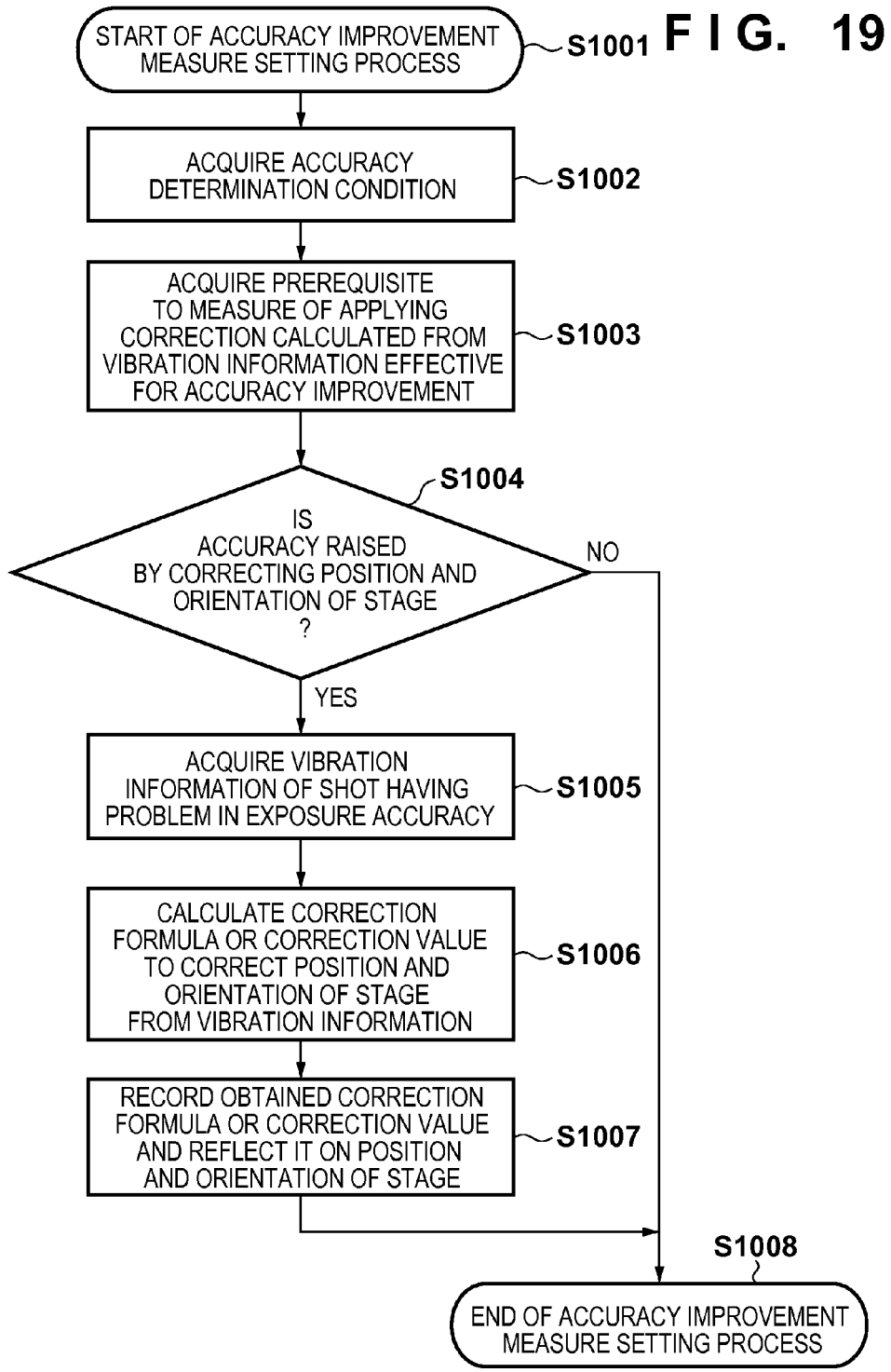
FIG. 19 is a flowchart of correcting the position and orientation of the substrate stage as a measure to improve the accuracy.

The flowcharts of FIGS. 17 to 19 show details of the accuracy improvement measure setting process in step S103 of FIG. 5.

In the flowchart of FIG. 17, the accuracy is improved by changing the exposure start time.

In the flowchart of FIG. 18, the accuracy is improved by changing the speed (acceleration) of the substrate stage 30.

In the flowchart of FIG. 19, the accuracy is improved by calculating a correction value or correction formula from the vibration information of a shot and correcting the position and orientation of the substrate stage 30 based on it.

The controller 40 can improve the accuracy using one of the flowcharts of FIGS. 17 to 19, like the flowcharts to perform accuracy determination, or using a composite of a plurality of flowcharts simultaneously. In the present invention, the controller 40 selects at least one of the flowcharts of FIGS. 17 to 19 and performs the accuracy improvement measure setting process in cases 1 to 4 to be explained below.

[Accuracy Improvement by Changing Exposure Start Time]

In the flowchart of FIG. 17, the exposure accuracy is improved by changing the exposure start time. More specifically, changing the exposure start time means starting the exposure after confirming that the vibration of the substrate stage 30 has so converged not to affect the exposure accuracy, as presented in the section of "Related Art". In step S801, the controller 40 starts the accuracy improvement measure setting process. In step S802, the controller 40 acquires, from the memory region 54 of the storage unit 41, one of the accuracy determination conditions in FIGS. 8 to 16 used to set the accuracy improvement shot in step S102 of FIG. 5. In step S803, the controller 40 acquires, from the storage unit 41, a prerequisite to a change in the exposure start time effective for accuracy improvement. The prerequisite to a change in the exposure start time effective for accuracy improvement is held in the storage unit 41. In step S804, the controller 40 judges whether the accuracy determination condition acquired in step S802 matches the prerequisite acquired in step S803.

For example, assume that in step S802, the controller 40 acquires "determination by the maximum value of the vibration" from the storage unit 41 as the accuracy determination condition used to set the accuracy improvement shot. Also assume that in step S803, the controller acquires, from the storage unit 41, a condition that the accuracy improvement shot has been set by "determination by the maximum value of the vibration" or "determination by the average value of the vibration" as a prerequisite to a change in the exposure start time effective for accuracy improvement. In this case, the accuracy determination condition acquired in step S802 matches the prerequisite acquired in step S803. For this reason, in step S805, the controller 40 decides to change the exposure start time and saves the decision in the memory region 53 of the storage unit 41. In step S806, the controller 40 ends the accuracy improvement measure setting process. If the accuracy determination condition acquired in step S802 is "determination by the exposure amount distribution", it does not match the prerequisite acquired in step S803. Hence, the change of the exposure start time in step S805 is not executed, and the accuracy improvement measure setting process ends in step S806.

[Accuracy Improvement by Changing Speed (Acceleration) of Substrate Stage]

In the flowchart of FIG. 18, the exposure accuracy is improved by changing the speed (acceleration) of the substrate stage 30 before or during the exposure. In step S901, the controller 40 starts the accuracy improvement measure setting process. In step S902, the controller 40 acquires, from the memory region 54 of the storage unit 41, one of the accuracy determination conditions in FIGS. 8 to 16 used to set the accuracy improvement shot, as in step S802 of FIG. 17. In step S903, the controller 40 acquires, from the storage unit 41, a prerequisite to a change in the speed (acceleration) of the substrate stage 30 effective for accuracy improvement. In step S904, the controller 40 judges whether the accuracy determination condition acquired in step S902 matches the prerequisite acquired in step S903. If the accuracy determination condition acquired in step S902 matches the prerequisite acquired in step S903, the controller 40 decides to change the speed (acceleration) of the substrate stage 30 and saves this in the memory region 52 of the storage unit 41. In step S906, the controller 40 ends the accuracy improvement measure setting process. In step S904, if the accuracy determination condition acquired in step S902 does not match the prerequisite acquired in step S903, the controller 40 ends the accuracy improvement measure setting process in step S906 without changing the speed (acceleration) of the substrate stage 30.

[Accuracy Improvement by Correcting Position and Orientation of Substrate Stage]

In the flowchart of FIG. 19, the exposure accuracy is improved by correcting the position and orientation of the substrate stage 30 before or during the exposure based on the vibration information. In step S1001, the controller 40 starts the accuracy improvement measure setting process. In step S1002, the controller 40 acquires, from the memory region 54 of the storage unit 41, one of the accuracy determination conditions in FIGS. 8 to 16 used to set the accuracy improvement shot, as in step S802 of FIG. 17. In step S1003, the controller 40 acquires, from the storage unit 41, a prerequisite to correction of the position and orientation of the substrate stage 30 effective for accuracy improvement. In step S1004, the controller 40 judges whether the accuracy determination condition acquired in step S1002 matches the prerequisite acquired in step S1003. If the accuracy determination condition acquired in step S1002 matches the prerequisite acquired in step S1003, the controller 40 acquires the vibration information of the shot from the memory region 55 shown in FIG. 4 in step S1005. In step S1006, the controller 40 calculates a correction formula or correction value to correct the position and orientation of the substrate stage 30 from the acquired vibration information. The correction formula or correction value can be calculated by calculating the tilt value of the substrate stage 30 obtained from a vibration waveform or using any other method. In step S1007, the controller 40 saves the correction formula or correction value calculated in step S1006 in the storage unit 41. In step S1008, the controller 40 ends the accuracy improvement measure setting process. If the accuracy determination condition acquired in step S1002 does not match the prerequisite acquired in step S1003, the controller 40 ends the accuracy improvement measure setting process in step S1008 without correcting the position and orientation of the substrate stage 30.

<TP Improvement Measure Setting Process>

Figure 20:
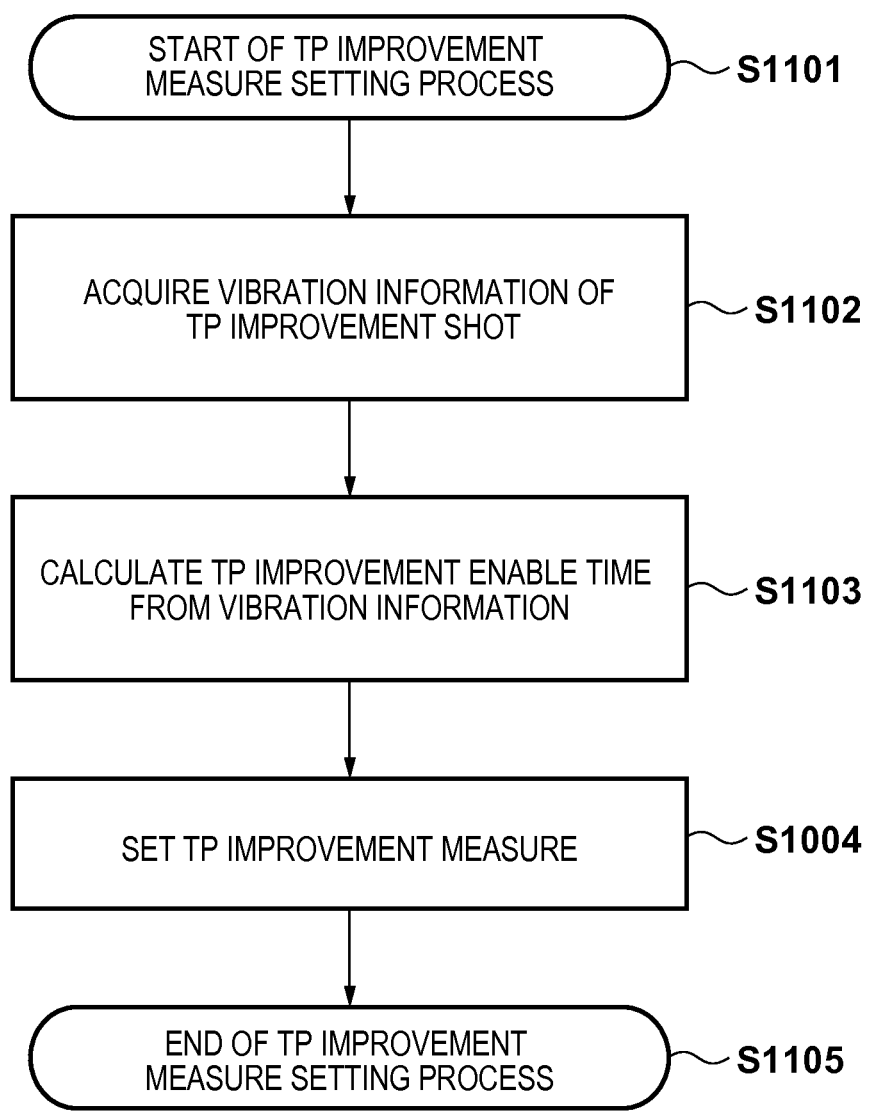
FIG. 20 is a flowchart of a setting process as a measure to improve the TP.

The flowchart of FIG. 20 shows details of the TP improvement measure setting process corresponding to step S104 of FIG. 5. In step S1101, the controller 40 starts the TP improvement measure setting process. In step S1102, the controller 40 acquires, from the memory region 55 shown in FIG. 4, the vibration information of the TP improvement shot to execute TP improvement in step S102 of FIG. 5. In step S1103, the controller 40 calculates a TP shortening enable time from the vibration information acquired in step S1102. In step S1104, the controller 40 stores the TP improvement measure to be executed and the shortening enable time in the storage unit 41 such that the TP improvement measure is executed for the obtained time. In this embodiment, the TP shortening time is the difference between the TP shortening investigation time P and the time at which the peak values of the amplitude of the substrate stage 30 has fallen within the tolerance value p used to determine whether TP shortening is possible. In this embodiment, the TP shortening time is represented by U in FIG. 25. In step S1104, the controller 40 sets the contents of the TP improvement measure such that the exposure process is performed by moving up the time of starting irradiation of the exposure light IL by the TP shortening time U obtained in step S1103. In step S1105, the controller 40 ends the TP improvement measure setting process.

The present invention will be explained below using five cases shown in FIGS. 21 to 25 in which the substrate stage 30 has different vibration states.

[Case 1]

In case 1, assume that the substrate stage 30 has a vibration state as shown in FIG. 21 during the exposure process after driven. Referring to FIG. 21, the abscissa represents the time T, and the ordinate represents the amplitude Fz of the vibration of the substrate stage 30. In the following embodiment, the explanation will be made concerning the z-axis. However, the explanation also applies to the x- and y-axes. S indicates the time at which irradiation of the exposure light IL starts; E, the time at which irradiation of the exposure light IL ends; f1, the tolerance (allowable range) of the exposure accuracy; p, tolerance (allowable range) used to determine whether TP improvement is possible; and P, the end time of investigation of the tolerance p. The shot exposed in case 1 is a shot of the first substrate of the lot and is not a shot to execute accuracy improvement or TP improvement on the second or subsequent substrate of the lot. As the exposure accuracy determination process, the processes of the flowcharts of FIGS. 8 and 9 are executed. The information of the flowcharts of FIGS. 8 and 9 is saved in the storage unit 41 in advance. The default value f1 used in the flowchart of FIG. 8 and the default average value (2.5 or less) of the vibration used in the flowchart of FIG. 9 are saved in the storage unit 41.

In step S101 of the flowchart of FIG. 5, the exposure process starts. In step S102, the controller 40 inquires of the storage unit 41 about whether the shot to execute the exposure process is an accuracy improvement shot, a TP improvement shot, or a shot of another type. In case 1, the target shot is a shot of the first substrate of the lot. Hence, the target shot is neither the accuracy improvement shot nor the TP improvement shot but a shot of another type. For this reason, the controller 40 starts driving the substrate stage 30 in step S105, and starts the exposure in step S106. In step S107, the controller advances the process to the determination process of the influence on the exposure accuracy shown in the flowcharts of FIGS. 8 and 9.

In the flowchart of FIG. 8, the controller 40 acquires f1 necessary for accuracy determination from the storage unit 41 (step S202), and acquires the vibration information (waveform in FIG. 21) of the substrate stage 30 during the exposure from the laser interferometer 13 (step S203). Next, the controller 40 determines whether the vibration of the substrate stage 30 falls within the tolerance value f1 (step S204). In case 1, the vibration of the substrate stage 30 falls within the tolerance value f1. For this reason, the controller 40 acquires the tolerance value p of the TP shortening condition and the investigation end time P from the storage unit 41 (step S205). In step S206, the controller 40 determines whether the vibration of the substrate stage 30 falls within the tolerance value p of the TP shortening condition. In case 1, since the vibration of the substrate stage 30 does not fall within the tolerance value p, the controller 40 ends the determination process of the flowchart of FIG. 8 (step S212).

In the flowchart of FIG. 9, the controller 40 acquires a condition value that the average value of the vibration as the default value necessary for the accuracy determination is 2.5 or less from the storage unit 41 (step S302), and acquires the vibration information (waveform in FIG. 21) of the substrate stage 30 during the exposure from the laser interferometer 13 (step S303). Next, the controller 40 calculates the average value of the vibration from the vibration information acquired in step S303 (step S304). Ten peak values of the amplitude during the exposure period (section S-E) shown in FIG. 21 are assumed to be 6, −4, 4, −2, 2, −1, 0.5, −0.5, 0.3, and −0.2. The controller 40 calculates the average value 2.05 from these values (step S304). The controller 40 then determines whether the calculated average value 2.05 is equal to or smaller than the default average value 2.5 (step S305). In case 1, since the default value is met, the controller 40 advances the process to step S306 that is the TP shortening condition acquisition process. The process from then on is the same as in the flowchart of FIG. 8, and a description thereof will be omitted.

According to the flowcharts of FIGS. 8 and 9, in case 1, the shot is a shot in which the vibration does not problematically affects the exposure accuracy, and the TP improvement measure is not executed, that is, a shot of another type. The process returns to the flowchart of FIG. 5, and the exposure process of the exposure target shot ends (step S108).

[Case 2]

In case 2, assume that the substrate stage 30 has a vibration state as shown in FIG. 22 during the exposure process after driven. All the elements shown on FIG. 22 are the same as in FIG. 21. The shot exposed for the first time in case 2 is a shot of the first substrate of the lot and is not a shot to execute accuracy improvement or TP improvement on the second or subsequent substrate of the lot. As the exposure accuracy determination process, the processes of the flowcharts of FIGS. 8 and 9 are executed. As the accuracy improvement measure process, the processes of the flowcharts of FIGS. 17 and 18 are executed. As in case 1, the default value f1 in the flowchart of FIG. 8 and the default average value (2.5 or less) of the vibration in FIG. 9 are saved in the storage unit 41.

When the exposure process starts in accordance with the flowchart of FIG. 5 (step S101), the controller 40 inquires of the storage unit 41 about whether the shot to execute the exposure process is an accuracy improvement shot, a TP improvement shot, or a shot of another type (step S102). In case 2, the target shot is a shot of another type. For this reason, the controller 40 starts driving the substrate stage 30 (step S105), and starts the exposure (step S106). The controller 40 advances the process to the flowcharts of FIGS. 8 and 9 corresponding to the determination process of the influence on the exposure accuracy (step S107).

In the flowchart of FIG. 8, the controller 40 acquires f1 necessary for accuracy determination from the storage unit 41 (step S202), and acquires the vibration information (waveform in FIG. 22) of the substrate stage 30 during the exposure from the laser interferometer 13 (step S203). Next, the controller 40 determines whether the vibration of the substrate stage 30 falls within the tolerance value f1 (step S204). In case 2, the vibration of the substrate stage 30 does not fall within the tolerance value f1. For this reason, the controller 40 displays "abnormality in the accuracy" on the console unit 42 (step S209), and records the shot of interest, the vibration information, and the condition (determination by the maximum value of the vibration) of the accuracy determination in the storage unit 41 (step S210). The controller 40 sets the shots at the same position of substrates to be exposed later as shots to execute the accuracy improvement measure to ensure the exposure accuracy, and saves the setting in the storage unit 41 (step S211). After the accuracy improvement shots are set (step S211), the controller 40 ends the determination process of the flowchart of FIG. 8 (step S212).

In the flowchart of FIG. 9, the controller 40 acquires a condition (2.5 or less) of the average value of the vibration as the default value necessary for the accuracy determination from the storage unit 41 (step S302), and acquires the vibration information (waveform in FIG. 22) of the substrate stage 30 during the exposure from the laser interferometer 13 (step S303). Next, the controller 40 calculates the average value of the vibration from the vibration information acquired in step S303 and the exposure time (step S304). Ten peak values of the amplitude during the exposure period (section S-E) shown in FIG. 22 are assumed to be 6, −5, 4, −4, 2, −1, 0.5, −0.5, 0.3, and −0.2. The controller 40 calculates the average value 2.35 of the vibration from these values (step S304). The controller 40 then determines whether the calculated average value 2.35 is equal to or smaller than the default average value 2.5 (step S305). In case 2, since the default value is met, the controller 40 acquires the tolerance value p of the TP shortening condition and the investigation end time P from the storage unit 41 (step S306). The controller 40 determines whether the vibration of the substrate stage 30 falls within the tolerance value p (step S307). In case 2, the vibration of the substrate stage 30 does not fall within the tolerance value p at the investigation end time P, the controller 40 ends the determination process of the flowchart of FIG. 9 (step S313).

Due to the difference in the accuracy determination condition, the accuracy may be judged not to be met in certain accuracy determination but to be met in another accuracy determination. In case 2, a shot that is set as an accuracy improvement shot once to ensure the accuracy of the exposure apparatus is assumed to remain the accuracy improvement shot even if it is judged to meet the accuracy in another accuracy determination. After the end of the flowcharts of FIGS. 8 and 9, the exposure process for the shot of the substrate to be exposed first ends (step S108).

The exposure process of a shot at the same coordinates of the second or subsequent substrate, which is set as the accuracy improvement shot in the process of step S211 of FIG. 8, will be described next. The exposure process of the accuracy improvement shot starts in accordance with the flowchart of FIG. 5 (step S101). The controller 40 inquires of the storage unit 41 about whether the shot to execute the exposure process is an accuracy improvement shot, a TP improvement shot, or a shot of another type (step S102). In case 2, the target shot is the accuracy improvement shot. For this reason, the controller 40 advances the process to the flowcharts of FIGS. 17 and 18.

In the flowchart of FIG. 17, the controller 40 starts the accuracy improvement measure setting process (step S801), and inquires of the storage unit 41 about the accuracy determination condition used to define the shot as the accuracy improvement shot (step S802). In case 2, the accuracy determination condition is "determination by the maximum value of the vibration". Next, the controller 40 acquires "determination by the average value of the vibration" that is the prerequisite to a change in the exposure start time effective for accuracy improvement (step S803). The controller 40 judges whether the accuracy determination condition acquired in step S802 matches the prerequisite acquired in step S803 (step S804). In case 2, since the conditions do not match, the flowchart of FIG. 17 ends (step S805).

In the flowchart of FIG. 18, the controller 40 starts the accuracy improvement measure setting process (step S901), and acquires "determination by the maximum value of the vibration" that is the condition used to define the shot as the accuracy improvement shot (step S902). Next, the controller 40 acquires "determination by the maximum value of the vibration" and "determination by the exposure amount distribution" that are the prerequisites to a change in the speed of the substrate stage 30 effective for accuracy improvement (step S903). The controller 40 judges whether the accuracy determination condition acquired in step S902 matches the prerequisites acquired in step S903 (step S904). In case 2, since the conditions match, the controller 40 saves the change in the speed of the substrate stage 30 in the memory region 52 of the storage unit 41 (step S905), and ends the flowchart of FIG. 18 (step S906).

After the end of the flowcharts of FIGS. 17 and 18, the process advances to the flowchart of FIG. 5. The substrate stage 30 is driven in accordance with the process set in FIG. 17 or 18 (step S105), and the exposure process is started (step S106). The shot that has undergone the accuracy improvement measure in FIG. 17 or 18 is assumed to have the vibration waveform shown in FIG. 21 during the exposure. The process then advances to the exposure accuracy determination process (step S107). The process from then on is the same as in case 1, and a description thereof will be omitted.

[Case 3]

In case 3, assume that the substrate stage 30 has a vibration state as shown in FIG. 23 during the exposure process after driven. The time S is the time at which irradiation of the exposure light IL starts, and the time E is the time at which irradiation of the exposure light IL ends. Times A and B are the times at which the exposure period S-E is divided. It is judged at the time A whether the default value of the exposure accuracy is met in the divided period S-A. It is judged at the time B whether the default value of the exposure accuracy is met in the divided period A-B. It is judged at the time E whether the default value of the exposure accuracy is met in the divided period B-E. f1 indicates the tolerance (allowable range) value used in the divided period S-A; f2, the tolerance (allowable range) value used in the divided period A-B; and f3, the tolerance (allowable range) value used in the divided period B-E. The average values of the vibration as the default values in FIG. 9 are saved in the storage unit 41 as 6 or less in the divided period S-A, 2.5 or less in the divided period A-B, and 1 or less in the divided period B-E.

The shot exposed in case 3 is exposed for the first time by the exposure apparatus and is neither the accuracy improvement shot nor the TP improvement shot. As the exposure accuracy determination process, the processes of the flowcharts of FIGS. 12 and 14 are executed. As the accuracy improvement measure process, the process of the flowchart of FIG. 19 is executed.

The controller 40 starts the exposure process in accordance with the flowchart of FIG. 5 (step S101), and inquires of the storage unit 41 about whether the target shot is an accuracy improvement shot, a TP improvement shot, or a shot of another type (step S102). In case 3, the target shot is a shot of another type. For this reason, the controller 40 starts driving the substrate stage 30 (step S105), and starts the exposure (step S106). The controller 40 advances the process to the flowcharts of FIGS. 12 and 14 to perform the determination process of the influence on the exposure accuracy in step S107.

In the flowchart of FIG. 12, the controller 40 acquires the pieces of time information A and B to divide the exposure period (step S502), and acquires the tolerance values f1 to f3 necessary for accuracy determination from the storage unit 41 (step S503). Next, the controller 40 acquires the vibration information (waveform in FIG. 23) of the substrate stage 30 during the exposure from the laser interferometer 13 (step S504). The controller 40 determines whether the vibration of the substrate stage 30 falls within the tolerance values f1, f2, and f3 in the respective divided periods (step S505). In case 3, the vibration in the divided period S-A does not fall within the tolerance value f1. For this reason, the controller 40 displays "abnormality in the accuracy" on the console unit 42 (step S510), and records the shot of interest, the vibration information, and the condition (determination by a plurality of maximum values of the vibration) of the accuracy determination in the storage unit 41 (step S511).

Next, the controller 40 sets the shots at the same coordinates of substrates to be exposed later as shots to execute the accuracy improvement measure to ensure the exposure accuracy, and saves the setting in the storage unit 41 (step S512). After the accuracy improvement shots are set, the controller 40 ends the determination process of the flowchart of FIG. 12 (step S513).

In the flowchart of FIG. 14, the controller 40 acquires the pieces of time information A and B to divide the exposure period (step S602). Next, the controller 40 acquires the average values (5 or less in the divided period S-A, 2.5 or less in the divided period A-B, and 1 or less in the divided period B-E) of the vibration in the respective divided periods as the default values necessary for accuracy determination from the storage unit 41 (step S603). Next, the controller 40 acquires the vibration information (waveform in FIG. 23) of the substrate stage 30 during the exposure from the laser interferometer 13 (step S604). The controller 40 calculates the average values of the vibration in the divided periods from the vibration information acquired in step S604 and the pieces of time information A and B acquired in step S602 (step S605). Assume that the peak values in the divided period S-A are 4 and −6, the peak values in the divided period A-B are 3, −4.5, 2.5, −2.5, and 1, and the peak values in the divided period B-E are 0.5, −0.5, 0.5, and −0.5. The controller 40 calculates the average values 5, 2.7, and 0.5 in the respective divided periods from these peak values (step S605).

The controller 40 determines whether all the calculated values are equal to or smaller than the default average values (step S606). In case 3, some of the calculated values do not meet the default values. For this reason, the controller 40 displays "abnormality in the accuracy" on the console unit 42 (step S611), and records the shot of interest, the vibration information, and the condition (determination by a plurality of average values of the vibration) of the accuracy determination in the storage unit 41 (step S612). Next, the controller 40 sets the shots at the same coordinates of substrates to be exposed later as shots to execute the accuracy improvement measure to ensure the exposure accuracy, and saves the setting in the storage unit 41 (step S613). After the accuracy improvement shots are set, the controller 40 ends the determination process of the flowchart of FIG. 14 (step S614). When the flowcharts of FIGS. 12 and 14 have ended, the exposure process of the shot to be exposed first in case 3 ends (step S108).

The exposure process of an accuracy improvement shot which is set as the target of the accuracy improvement measure in step S512 of FIG. 12 or step S613 of FIG. 14 will be described next. The exposure process of the accuracy improvement shot starts in accordance with the flowchart of FIG. 5 (step S101). The controller 40 inquires of the storage unit 41 about whether the target shot of the exposure process is an accuracy improvement shot, a TP improvement shot, or a shot of another type (step S102). The target shot is the accuracy improvement shot. For this reason, the controller 40 advances the process to the flowchart of FIG. 19 that defines the accuracy improvement measure setting process.

In the flowchart of FIG. 19, the controller 40 starts the accuracy improvement measure setting process (step S1001). Next, the controller 40 inquires of the storage unit 41 about the accuracy determination condition used to define the shot to execute the accuracy improvement measure, and acquires a reply "determination by a plurality of maximum values of the vibration" and "determination by a plurality of average values of the vibration" (step S1002). The controller 40 then acquires "determination by a plurality of maximum values of the vibration" and "determination by a plurality of average values of the vibration" that are the prerequisites to correction of the position and orientation of the stage effective for accuracy improvement (step S1003). The controller 40 judges whether the accuracy determination conditions acquired in step S1002 matches the prerequisites acquired in step S1003 (step S1004). In case 3, the conditions match. Hence, to correct the position and orientation of the stage, first, the vibration information of the shot having a problem in the exposure accuracy is acquired (step S1005).

Next, the controller 40 calculates a correction formula or correction value to correct the position of the stage from the vibration information. In case 3, as shown in FIG. 23, the peaks of the vibration fall outside the tolerances in the negative direction of the maximum amplitude of the waveform.

Hence, the controller 40 calculates an offset H in the positive direction which is to be inserted at a position in the z-axis direction of the stage at the time of stage driving (step S1006). The controller 40 adds the offset H to the value in the memory region 52 of the storage unit 41 and saves the value such that the correction value (offset H) obtained in step S1006 is reflected on the driving of the substrate stage 30 (step S1007), and ends the flowchart of FIG. 19 (step S1008). Any method is applicable to obtain the correction value H in the process of step S1006. A method of calculating not the correction value but a correction formula and deriving the correction value H from the calculated correction formula may be applied.

The flowchart of FIG. 5 explains that the exposure starts after the completion of stage driving. However, the substrate stage 30 can be driven even during the exposure. It is also possible to execute the accuracy improvement measure by driving the substrate stage 30 during the exposure using the correction value or correction formula calculated in step S1006. After the end of the flowchart of FIG. 19, the controller 40 advances the process to the flowchart of FIG. 5. The substrate stage 30 is driven in accordance with the setting process in FIG. 19 (step S105), and the exposure process is started (step S106). The shot that has undergone the accuracy improvement measure in FIG. 19 has the vibration waveform shown in FIG. 21 during the exposure. The process then advances to the exposure accuracy determination process (step S107). The process from then on is the same as in case 1, and a description thereof will be omitted.

[Case 4]

Figure 24:
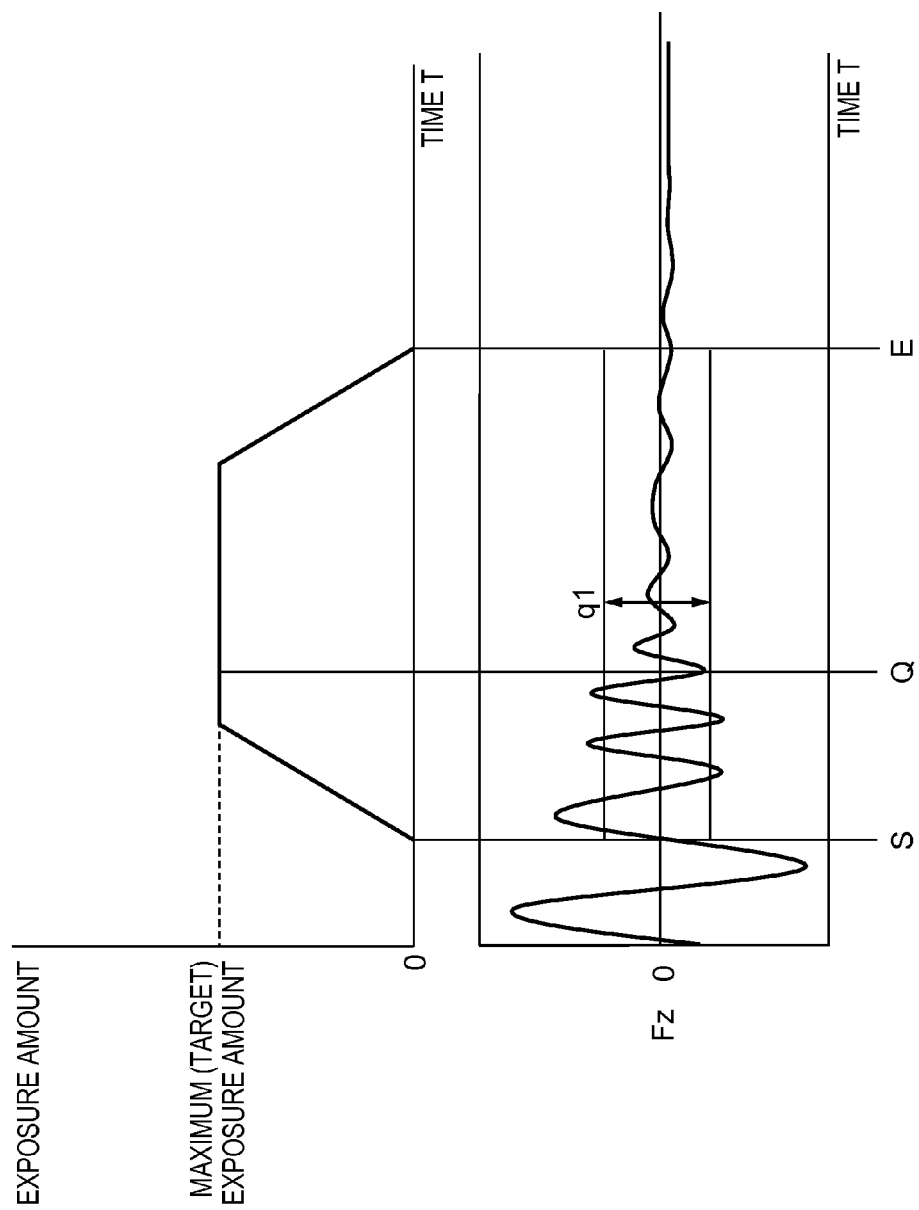
FIG. 24 is a timing chart showing the vibration information and the light amount distribution of the substrate stage that have occurred in case 4.

In case 4, assume that an exposure is executed under the vibration state and exposure amount as shown in FIG. 24 during the exposure process after the substrate stage 30 is driven. The shot exposed in case 4 is exposed for the first time by the exposure apparatus. The exposure accuracy determination process is performed in accordance with the flowchart of FIG. 10, and the accuracy improvement measure process is performed in accordance with the flowchart of FIG. 17. The ratio value for the default value (condition) in FIG. 10 is 70% to 100%.

The exposure process starts in accordance with the flowchart of FIG. 5 (step S101). The controller 40 inquires of the storage unit 41 about whether the shot to execute the exposure process is an accuracy improvement shot, a TP improvement shot, or a shot of another type (step S102). In case 4, the target shot is a shot of another type. The controller 40 drives the substrate stage 30 (step S105), and starts the exposure (step S106). The controller 40 then executes the determination process of the influence on the exposure accuracy in step S107 in accordance with the flowchart of FIG. 10.

In the flowchart of FIG. 10, the controller 40 acquires the tolerance value of the vibration (q1 in FIG. 24) (step S402), and acquires the default value (70% to 100%) necessary for accuracy determination from the storage unit 41 (step S403). The controller 40 acquires the vibration information (of FIG. 24) of the substrate stage 30 during the exposure from the laser interferometer 13 (step S404). The controller 40 acquires, from the light amount sensor 6, the exposure amounts from the start to the end of exposure to create the exposure amount distribution (step S405), and creates the exposure amount distribution (of FIG. 24) by setting a break at the portion Q when the peaks of the vibration have converged into the tolerance value acquired in step S402 (step S406). The controller 40 calculates the area of the exposure amount in the divided period Q-E where the amplitude of the vibration is small, and obtains the ratio to the exposure amount during the overall exposure period. Assume that the ratio value calculated in case 4 is 60%. The controller 40 judges whether the calculated ratio value (60%) meets the default 70% to 100% acquired in step S402 (step S407).

In case 4, the calculated ratio value does not meet the default value. For this reason, the controller 40 displays "abnormality in the accuracy" on the console unit 42 (step S412), and records the shot of interest, the vibration information, and the condition (determination by the exposure amount distribution) of the accuracy determination in the storage unit 41 (step S413). Next, the controller 40 sets the shots at the same coordinates of substrates to be exposed later as shots to execute the accuracy improvement measure to ensure the exposure accuracy, and saves the setting in the storage unit 41 (step S414). After the accuracy improvement shots are set, the determination process of the flowchart of FIG. 10 ends (step S614). When the flowchart of FIG. 10 has ended, the exposure process of the shot to be executed for the first time in case 4 ends (step S108).

The exposure process of a shot which is set as the target of the accuracy improvement measure in step S414 of FIG. 10 will be described next. The exposure process of the accuracy improvement shot starts in accordance with the flowchart of FIG. 5 (step S101). The controller 40 inquires of the storage unit 41 about whether the target shot of the exposure process is an accuracy improvement shot, a TP improvement shot, or a shot of another type (step S102). The target shot of the exposure process is the accuracy improvement shot. For this reason, in step S103, the controller 40 advances the process to the flowchart of FIG. 17 representing the accuracy improvement measure setting process.

In the flowchart of FIG. 17, the controller 40 starts the accuracy improvement measure setting process (step S801), inquires of the storage unit 41 about the accuracy determination condition used to define the shot to execute the accuracy improvement measure, and acquires a reply "determination by the exposure amount distribution" (step S802). The controller 40 then acquires "determination by the exposure amount distribution" that is the prerequisite to a change in the exposure start time effective for accuracy improvement (step S803). The controller 40 judges whether the accuracy determination condition acquired in step S802 matches the prerequisite acquired in step S803 (step S804). In case 4, the conditions match. Hence, the exposure start time is changed and stored in the memory region 53 (step S805), and the flowchart of FIG. 17 ends (step S806).

After the end of the flowchart of FIG. 17, the process advances to the flowchart of FIG. 5. The controller 40 drives the substrate stage 30 in accordance with the process set in FIG. 17 (step S105), and starts the exposure process (step S106). The shot that has undergone the measure in FIG. 17 has the vibration waveform shown in FIG. 21 during the exposure. The process then advances to the exposure accuracy determination process (step S107). The process from then on is the same as in case 1, and a description thereof will be omitted.

The process contents of the flowchart of FIG. 15 are similar to those of the flowchart of FIG. 10. Since there is no major difference in the calculation methods and the like, a description of the flowchart of FIG. 15 will be omitted.

[Case 5]

Figure 25:
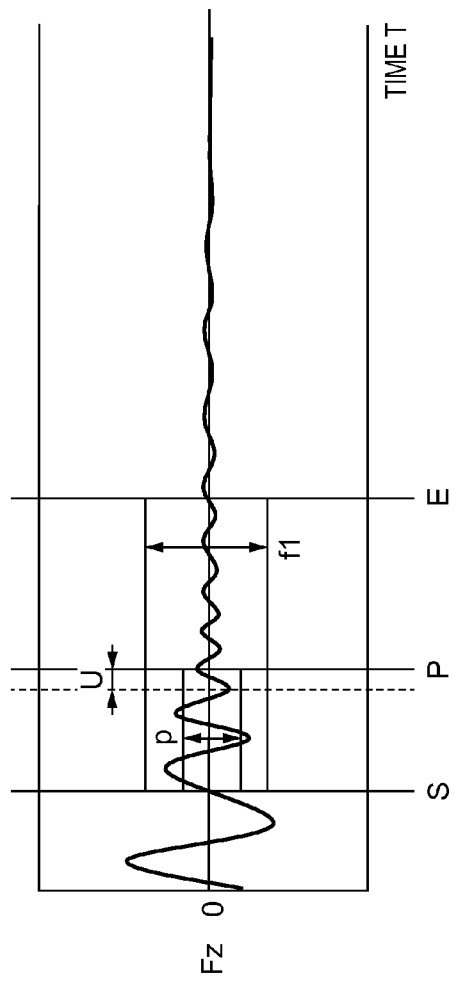
FIG. 25 is a timing chart of the vibration information of the substrate stage that has occurred in case 5.

In case 5, assume that the substrate stage 30 has a vibration state as shown in FIG. 25 during the exposure process after driven. The shot exposed in case 5 is exposed for the first time by the exposure apparatus. The exposure accuracy determination process is performed in accordance with the flowchart of FIG. 8. The exposure process starts in accordance with the flowchart of FIG. 5 (step S101). The controller 40 inquires of the storage unit 41 about whether the shot to execute the exposure process is an accuracy improvement shot, a TP improvement shot, or a shot of another type (step S102). The target shot is a shot of another type. The controller 40 drives the substrate stage 30 (step S105), and starts the exposure (step S106). In step S107, the controller 40 advances the process to the flowchart of FIG. 8 representing the determination process of the influence on the exposure accuracy.

In the flowchart of FIG. 8, the controller 40 acquires f1 necessary for accuracy determination from the storage unit 41 (step S202), and acquires the vibration information (waveform in FIG. 25) of the substrate stage 30 during the exposure from the laser interferometer 13 (step S203). The controller 40 determines whether the vibration of the substrate stage 30 falls within the tolerance value f1 (step S204). In case 5, the vibration falls within the tolerance value f1. The controller 40 acquires the tolerance value p of the TP shortening condition and the investigation time P from the storage unit 41 (step S205). The controller 40 determines whether the vibration of the substrate stage 30 falls within the tolerance value p at the investigation time P (step S206). In case 5, since the vibration falls within the tolerance value p, the controller 40 records the shot of interest and the vibration information in the storage unit 41 (step S207). Next, the controller 40 performs the process of setting a shot to perform the TP improvement measure (step S208). In case 5, the target shot of the setting process in step S208 is the shot at the same coordinates of the next substrate. After the shot to perform the TP improvement measure is set, the controller 40 ends the determination process of the flowchart of FIG. 8 (step S212).

The exposure process of the shot which is set as the target of the TP improvement measure by the setting process in step S208 of FIG. 8 will be described next. The exposure process of the accuracy improvement shot starts in accordance with the flowchart of FIG. 5 (step S101). The controller 40 inquires of the storage unit 41 about whether the target shot of the exposure process is an accuracy improvement shot, a TP improvement shot, or a shot of another type (step S102). In case 5, the target shot is the TP improvement shot. For this reason, in step S104, the controller 40 advances the process to the flowchart of FIG. 18 representing the TP improvement measure setting process. The TP improvement measure setting process starts based on the flowchart of FIG. 18 (step S1101). The controller 40 acquires the vibration information of the TP improvement shot (step S1102). The controller 40 calculates a TP improvement shortening enable time from the vibration information (step S1103). In case 5, the TP can be shortened by the time U from the time at which the peaks of the vibration of the substrate stage 30 start falling within the tolerance p of the TP shortening condition to the time at which the peaks of the opposite phase fall within the tolerance p (see FIG. 25). Any method other than that described above is applicable to obtain the TP shortening enable time. The controller 40 moves up the predetermined irradiation start time S of the exposure light IL by the TP shortening enable time U obtained in step S1103 as the TP improvement measure, and records the TP improvement measure in the storage unit 41 (step S1104). When the TP improvement measure setting is completed, the flowchart of FIG. 18 ends (step S1005), and the process returns to the flowchart of FIG. 5.

The substrate stage 30 is driven in accordance with the flowchart of FIG. 5 (step S105), and irradiation of the exposure light IL starts (step S106). The time of starting the irradiation of the exposure light IL is moved up by U calculated in step S1104 of FIG. 14. In step S107, the process advances to the flowchart of FIG. 8 representing the determination process of the influence on the exposure accuracy.

Figure 26:
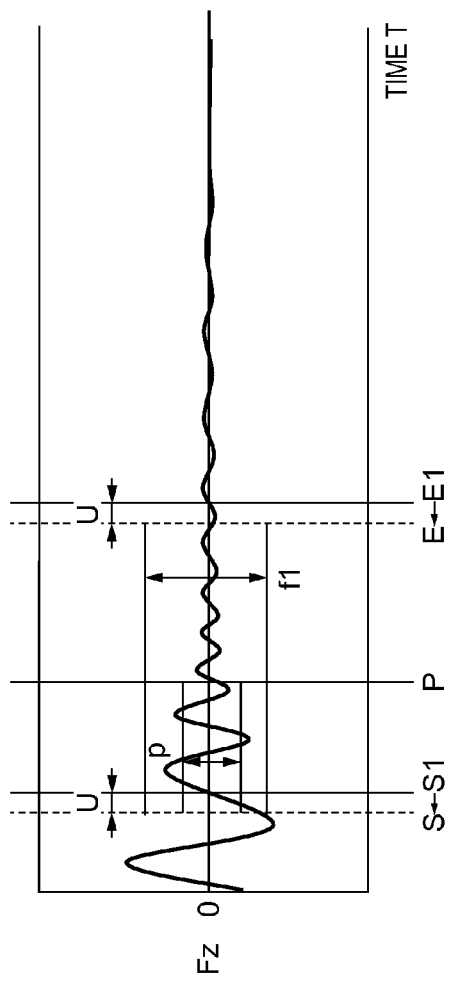
FIG. 26 is a timing chart of the vibration information of the substrate stage after a measure to improve the TP has taken in case 5.

The controller 40 acquires f1 necessary for accuracy determination from the storage unit 41 in accordance with the flowchart of FIG. 8 (step S202), and acquires the vibration information of the substrate stage 30 during the exposure from the laser interferometer 13 (step S203). The acquired vibration information is shown in FIG. 26. The controller 40 determines whether the vibration of the substrate stage 30 falls within the tolerance value f1 (step S204). The vibration shown in FIG. 26 falls within the tolerance value f1. For this reason, the controller 40 acquires the tolerance value p of the TP shortening condition and the investigation time P from the storage unit 41 (step S205). The controller 40 determines whether the vibration of the substrate stage 30 falls within the tolerance value p (step S206). In the vibration shown in FIG. 26, there is a peak that falls within the tolerance p of the TP shortening condition before the time P. However, since it is impossible to confirm that the peak of the opposite phase falls within the tolerance p, it cannot be determined that the vibration falls within the tolerance value p. For this reason, the controller 40 ends the determination process of the flowchart of FIG. 8 (step S212) and returns the process to the flowchart of FIG. 5. In the flowchart of FIG. 5, when step S107 of determining the influence on the exposure accuracy is completed, the exposure process of the TP improvement shot ends (step S108).

FIG. 26 shows an irradiation start time S1 of the exposure light IL and an end time E1 before the TP improvement measure and the irradiation start time S of the exposure light IL and the end time E after the TP improvement measure. The irradiation start times S1 and S of the exposure light IL have a relationship S=S1−U. The irradiation end times E1 and E of the exposure light IL have a relationship E=E1−U. That is, the exposure end time E is moved up by the TP shortening enable time U, and the TP is shortened, as can be seen.

[Device Manufacturing]

A method of manufacturing a device (semiconductor device, liquid crystal display device, or the like) according to an embodiment of the present invention will be described next. A method of manufacturing a semiconductor device will be exemplified here. A semiconductor device is manufactured by performing a preprocess of forming an integrated circuit on a wafer, and a post-process of completing, as a product, the integrated circuit chip on the wafer formed by the preprocess. The preprocess includes a step of exposing, using the above-described exposure apparatus, a wafer to which a photoresist is applied, and a step of developing the wafer. The post-process includes an assembly step (dicing and bonding) and a packaging step (encapsulation). Note that a liquid crystal display device is manufactured by performing a step of forming a transparent electrode. The step of forming the transparent electrode includes a step of applying a photoresist to a glass substrate on which a transparent conductive film is deposited, and a step of exposing, using the above-described exposure apparatus, the glass substrate to which the photoresist is applied. According to the device manufacturing method of this embodiment, it is possible to manufacture a device having quality higher than before.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-133273, filed Jun. 12, 2012, which is hereby incorporated by reference herein in its entirety.

What is claimed is:

1. An exposure apparatus for performing an exposure with light from a light source for each shot region on a substrate, the apparatus comprising:
   a stage configured to move while holding the substrate;
   a measurement device configured to measure a vibration of the stage;
   a sensor configured to measure a light amount of the light; and
   a controller configured to:
      determine whether the vibration of the stage measured by the measurement device during an exposure period of a first shot region of a first substrate falls within an allowable range based on a ratio of an accumulated exposure amount obtained based on the light amount measured by the sensor in a period, among the exposure period, where an amplitude of the vibration of the stage is not more than a predetermined value, to an accumulated exposure amount during the exposure period; and
      change a first period, from when the stage has moved for the exposure of the second shot region to when the exposure of the second shot region is started, to:
         when the vibration of the stage measured by the measurement device during the exposure period of the first shot region of the first substrate does not fall within the allowable range, a longer period that is longer than a second period, from when the stage has moved for the exposure of the first shot region to when the exposure of the first shot region is started, so that the vibration of the stage during an exposure period of the second shot region of the second substrate falls within the allowable range; and
         when the vibration of the stage measured by the measurement device during the exposure period of the first shot region of the first substrate falls within the allowable range, a shorter period that is shorter than the second period and during which the vibration of the stage falls within the allowable range, the second substrate being different from the first substrate and being exposed after the first substrate.

2. The apparatus according to claim 1, wherein the controller:
   when the vibration of the stage during the exposure period of the first shot region of the first substrate falls within the allowable range and the amplitude of the vibration of the stage at a time at which a predetermined time has elapsed from a start of an exposure of the first shot region is smaller than the predetermined value, changes the exposure start time of the second shot region of the second substrate to a time earlier than the exposure start time of the first shot region and on which the vibration of the stage falls within the allowable range; and
   when the vibration of the stage measured by the measurement device during the exposure period of the first shot region of the first substrate falls within the allowable range and the amplitude of the vibration is not smaller than the predetermined value, does not change the exposure start time of the second shot region of the second substrate.

3. A method of manufacturing a device, the method comprising:
   exposing a substrate to radiant energy using an exposure apparatus with light from a light source for performing an exposure for each shot region on a substrate;
   developing the exposed substrate; and
   processing the developed substrate to manufacture the device,
   wherein the exposure apparatus includes:
      a stage configured to move while holding the substrate;
      a measurement device configured to measure a vibration of the stage;
      a sensor configured to measure a light amount of the light; and
      a controller configured to:
         determine whether the vibration of the stage measured by the measurement device during an exposure period of a first shot region of a first substrate falls within an allowable range based on a ratio of an accumulated exposure amount obtained based on the light amount measured by the sensor in a period, among the exposure period, where an amplitude of the vibration of the stage is not more than a predetermined value, to an accumulated exposure amount during the exposure period; and
         change a first period, from when the stage has moved for the exposure of the second shot region to when the exposure of the second shot region is started, to:
            when the vibration of the stage measured by the measurement device during the exposure period of the first shot region of the first substrate does not fall within the allowable range, a longer period that is longer than a second period, from when the stage has moved for the exposure of the first shot region to when the exposure of the first shot region is started, so that the vibration of the stage during an exposure period of the second shot region of the second substrate falls within the allowable range; and
            when the vibration of the stage measured by the measurement device during the exposure period of the first shot region of the first substrate falls within the allowable range, a shorter period that is shorter than the second period and during which the vibration of the stage falls within the allowable range, the second substrate being different from the first substrate and being exposed after the first substrate.

4. An exposure apparatus for performing an exposure with light from a light source for each shot region on a substrate, the apparatus comprising:
a stage configured to move while holding the substrate;
a measurement device configured to measure a vibration of the stage;
a sensor configured to measure a light amount of the light; and
a controller configured to:
determine whether the vibration of the stage measured by the measurement device during an exposure period of a first shot region of a first substrate falls within an allowable range based on a ratio of an accumulated exposure amount obtained based on the light amount measured by the sensor in a period, among the exposure period, where an amplitude of the vibration of the stage is not more than a predetermined value, to an accumulated exposure amount during the exposure period; and
when the vibration of the stage measured by the measurement device during the exposure period of the first shot region of the first substrate falls within the allowable range, change a first period, from when the stage has moved for the exposure of the second shot region to when the exposure of the second shot region is started, to a shorter period that is shorter than a second period, from when the stage has moved for the exposure of the first shot region to when the exposure of the first shot region is started, and during which the vibration of the stage falls within the allowable range, the second substrate being different from the first substrate and being exposed after the first substrate.

5. The apparatus according to claim 4, wherein the controller, when the vibration of the stage measured by the measurement device during the exposure period of the first shot region of the first substrate does not fall within the allowable range, change the first period to a longer period that is longer than the second period so that the vibration of the stage during the exposure period of the second shot region of the second substrate falls within the allowable range.

6. The apparatus according to claim 4, wherein the second shot region of the second substrate is at a position in a shot layout same as the first shot region of the first substrate.

7. The apparatus according to claim 4, wherein the second shot region of the second substrate is at a position in a shot layout adjacent to the first shot region of the first substrate.

8. The apparatus according to claim 4, wherein the controller:
when the vibration of the stage during the exposure period of the first shot region of the first substrate falls within the allowable range and the amplitude of the vibration of the stage at a time at which a predetermined time has elapsed from a start of the exposure of the first shot region is smaller than the predetermined value, changes the exposure start time of the second shot region of the second substrate to a time earlier than the exposure start time of the first shot region and on which the vibration of the stage falls within the allowable range; and
when the vibration of the stage measured by the measurement device during the exposure period of the first shot region of the first substrate falls within the allowable range and the amplitude of the vibration is not smaller than the predetermined value, does not change the exposure start time of the second shot region of the second substrate.

9. The apparatus according to claim 4, further comprising:
a storage unit; and
wherein the controller stores, in the storage unit, information of the first shot region of the first substrate when the vibration of the stage during the exposure period of the first shot region of the first substrate does not fall within the allowable range.

10. The apparatus according to claim 4, further comprising:
a console unit; and
wherein the controller displays, on the console unit, an operation state of the exposure apparatus or information representing occurrence of an error when the vibration of the stage during the exposure period of the first shot region of the first substrate does not fall within the allowable range.

11. A method of manufacturing a device, the method comprising the steps of:
exposing a substrate to radiant energy using an exposure apparatus performing an exposure with light from a light source for each shot region on a substrate;
developing the exposed substrate; and
processing the developed substrate to manufacture the device,
wherein the exposure apparatus includes:
a stage configured to move while holding the substrate;
a measurement device configured to measure a vibration of the stage;
a sensor configured to measure a light amount of the light; and
a controller configured to:
determine whether the vibration of the stage measured by the measurement device during an exposure period of a first shot region of a first substrate falls within the allowable range, in the exposing step, based on a ratio of an accumulated exposure amount obtained based on the light amount measured by the sensor in a period, among the exposure period, where an amplitude of the vibration of the stage is not more than a predetermined value, to an accumulated exposure amount during the exposure period; and
when the vibration of the stage measured by the measurement device during the exposure period of the first shot region of the first substrate falls within the allowable range, change a first period, from when the stage has moved for the exposure of the second shot region to when the exposure of the second shot region is started, to a shorter period that is shorter than a second period, from when the stage has moved for the exposure of the first shot region to when the exposure of the first shot region is started, and during which the vibration of the stage falls within the allowable range, the second substrate being different from the first substrate and being exposed after the first substrate.

* * * * *